US009685597B2

(12) United States Patent
Marukawa et al.

(10) Patent No.: US 9,685,597 B2
(45) Date of Patent: Jun. 20, 2017

(54) CURABLE COMPOSITION FOR SEALING OPTICAL SEMICONDUCTOR

(71) Applicant: DAICEL CORPORATION, Osaka-shi, Osaka (JP)

(72) Inventors: Masanori Marukawa, Himeji (JP); Tomoya Egawa, Himeji (JP); Akihiro Shibamoto, Himeji (JP)

(73) Assignee: DAICEL CORPORATION, Osaka-Shi (JP)

( * ) Notice: Subject to any disclaimer, the term of this patent is extended or adjusted under 35 U.S.C. 154(b) by 0 days.

(21) Appl. No.: 14/894,438

(22) PCT Filed: May 21, 2014

(86) PCT No.: PCT/JP2014/064201
§ 371 (c)(1),
(2) Date: Nov. 27, 2015

(87) PCT Pub. No.: WO2014/192839
PCT Pub. Date: Dec. 4, 2014

(65) Prior Publication Data
US 2016/0126431 A1    May 5, 2016

(30) Foreign Application Priority Data

May 28, 2013   (JP) .................. 2013-111763
Jan. 23, 2014   (JP) .................. 2014-010808

(51) Int. Cl.
*H01L 29/49*    (2006.01)
*H01L 33/56*    (2010.01)
(Continued)

(52) U.S. Cl.
CPC .............. *H01L 33/56* (2013.01); *C08G 59/02* (2013.01); *C08G 59/24* (2013.01); *C08G 59/60* (2013.01);
(Continued)

(58) Field of Classification Search
CPC .................................................. C08G 59/687
See application file for complete search history.

(56) References Cited

U.S. PATENT DOCUMENTS

| 8,828,500 B2 | 9/2014 | Arai et al. |
| 2010/0137530 A1 | 6/2010 | Arai et al. |

(Continued)

FOREIGN PATENT DOCUMENTS

| JP | 6-157876 A | 6/1994 |
| JP | 2007-46035 A | 2/2007 |

(Continued)

OTHER PUBLICATIONS

International Search Report, issued in PCT/JP2014/064201, dated Aug. 26, 2014.
(Continued)

*Primary Examiner* — Michael Shingleton
(74) *Attorney, Agent, or Firm* — Birch, Stewart, Kolasch & Birch, LLP

(57) ABSTRACT

A curable composition according to the present invention for sealing optical semiconductor includes components (A), (B), and (C). Another curable composition according to the present invention for sealing optical semiconductor further includes a component (D) in addition to the components (A), (B) and (C). The component (A) is a compound containing at least one functional group selected from the group consisting of epoxy groups, oxetanyl groups, vinyl ether groups, and (meth)acryloyl groups. The component (B) is a cycloaliphatic epoxy compound. The component (C) is a curing catalyst including a cationic component and an anionic component and generating an acid upon application of light or heat, where the cationic component contains an aromatic ring, and the anionic component contains a central element selected from boron and phosphorus. The component (D) is conductive fiber-bearing particles each including a particu- (Continued)

late substance and a fibrous conductive substance lying on or over the particulate substance.

20 Claims, 1 Drawing Sheet

(51) Int. Cl.
| | |
|---|---|
| *C08G 59/68* | (2006.01) |
| *C08L 63/00* | (2006.01) |
| *C08G 65/18* | (2006.01) |
| *C08G 59/02* | (2006.01) |
| *H01B 1/22* | (2006.01) |
| *H01L 51/00* | (2006.01) |
| *H01L 51/52* | (2006.01) |
| *C08G 59/60* | (2006.01) |
| *C08G 59/24* | (2006.01) |

(52) U.S. Cl.
CPC ........... *C08G 59/68* (2013.01); *C08G 59/688* (2013.01); *C08G 65/18* (2013.01); *C08L 63/00* (2013.01); *H01B 1/22* (2013.01); *H01L 51/0035* (2013.01); *H01L 51/5237* (2013.01); *C08L 2205/02* (2013.01)

(56) References Cited

U.S. PATENT DOCUMENTS

| | | | |
|---|---|---|---|
| 2010/0267857 A1* | 10/2010 | Kimura | ................ C08G 59/687 522/45 |
| 2011/0282010 A1 | 11/2011 | Fujita | |

FOREIGN PATENT DOCUMENTS

| | | | |
|---|---|---|---|
| JP | 2007-169172 | A | 7/2007 |
| JP | 2008-31438 | A | 2/2008 |
| JP | 2010-24364 | A | 2/2010 |
| JP | 2010-126699 | A | 6/2010 |
| JP | 2010-163566 | A | 7/2010 |
| JP | 2012-1688 | A | 1/2012 |
| JP | 2012-17368 | A | 1/2012 |
| JP | 2013-91676 | A | 5/2013 |
| JP | 2013-186976 | A | 9/2013 |
| WO | WO 2009/057600 | A1 | 5/2009 |
| WO | WO 2012/020688 | A1 | 2/2012 |

OTHER PUBLICATIONS

Extended European Search Report for Application No. 14804282.3, dated Dec. 16, 2016.

* cited by examiner

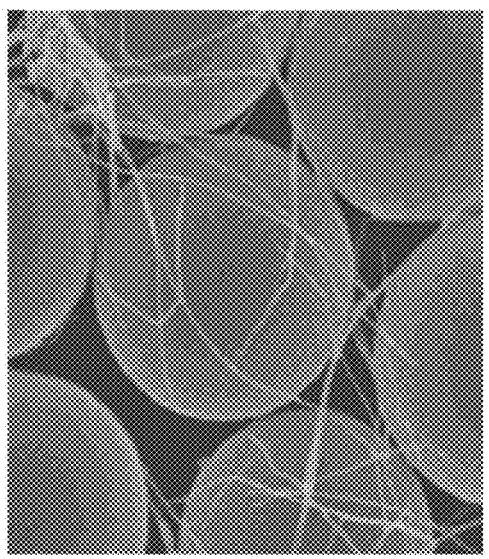

CURABLE COMPOSITION FOR SEALING OPTICAL SEMICONDUCTOR

TECHNICAL FIELD

The present invention relates to a curable composition and a cured product of the curable composition, both of which are used for the sealing of optical semiconductor elements such as light-emitting diodes (LEDs) and organic electroluminescence elements (organic EL). The present invention also relates to an optical semiconductor and an optical semiconductor device prepared using the curable composition. The present invention claims priority to Japanese Patent Application No. 2013-111763 filed to Japan on May 28, 2013 and to Japanese Patent Application No. 2014-010808 filed to Japan on Jan. 23, 2014, the entire contents of which are incorporated herein by reference.

BACKGROUND ART

Optical semiconductor elements such as light-emitting diodes and organic electroluminescence elements advantageously emit highly bright light with a low power. Attempts have been made to apply the optical semiconductor elements expansively to a multiplicity of applications such as lighting devices and display devices.

Disadvantageously, however, these optical semiconductor elements have low durability against moisture and gases. Such low moisture and gas durability may cause the optical semiconductor elements to have lower brightness and, in some cases, to fail to emit light.

As possible effective solutions to the disadvantage, a variety of techniques are attempted for sealing such optical semiconductor elements with curable resin compositions. In particular, sealing techniques using epoxy resin compositions offer excellent sealing performance and are expected to be promising techniques.

Assume that optical semiconductor elements are sealed with curable resin compositions. In this case, there is a need for curable resin compositions that exhibit low permeability and high gas-barrier properties and do not impair the optical semiconductor elements and any other materials by gases (outgases) derived from the resin compositions.

Patent Literature (PTL) 1 discloses a sealing agent for organic electroluminescence elements. The sealing agent contains 20 to 80 parts by weight of an epoxy compound containing a cycloaliphatic skeleton; and 80 to 20 parts by weight of an epoxy compound containing an aromatic ring. The literature, however, fails to describe a countermeasure against outgases derived from the resin composition.

PTL 2 discloses curable resin composition for sealing organic electroluminescence element. The curable resin composition includes an epoxy resin (A), an epoxy resin (B), a latent photoacid catalyst (C), and a silane coupling agent (D). The epoxy resin (A) contains at least two glycidyl groups per molecule and has a molecular weight of 200 to 7000. The epoxy resin (B) contains at least one glycidyl group per molecule and has a molecular weight of 20000 to 100000. The latent photoacid catalyst (C) is activated upon application of energy rays to generate an acid. The silane coupling agent contains a glycidyl group in molecule. The curable resin composition contains the component (B) in a proportion of 30 to 150 parts by weight per 100 parts by weight of the component (A). The curable resin composition contains the component (C) in a proportion of 0.1 to 10 parts by weight and the component (D) in a proportion of 0.1 to 10 parts by weight per 100 parts by weight of the total of the component (A) and the component (B). However, outgassing from the curable resin composition is not restrained at sufficient level.

PTL 3 discloses a resin composition that is an adhesive for packaging of elements such as organic electroluminescence elements. The resin composition includes an epoxy compound (A), a novolac resin (B), a cationic photoinitiator (C), and a filler (D). The literature, however, fails to describe a countermeasure against outgassing.

PTL 4 discloses a low moisture-permeability resin composition. The resin composition includes a compound (A), a compound (B), and a polymerization initiator (C). The compound (A) contains two or more reactive functional groups (a) per molecule. The compound (B) contains one reactive functional group (b) per molecule and has a molecular weight of 50 to 1000. The resin composition is for use in electronic devices that require low moisture permeability. The literature, however, fails to describe the curability of the resin composition and countermeasures against outgassing.

PTL 5 discloses a curable resin. The curable resin includes an epoxy resin containing a terminal oxirane ring. The curable resin further includes at least one of a cycloaliphatic epoxy resin and an oxetane-ring-containing compound. The curable resin emits outgases in a large volume because of including these components. PTL 6 discloses an epoxy resin composition including a component having a biphenyl structure. The epoxy resin compositions disclosed in PTL 4 and PTL 6 include a components having a biphenyl structure and emit outgases such as acrolein by catalysts.

Independently, optical semiconductor elements such as light-emitting diodes and organic electroluminescence elements employ fine particles having conductivity (conductive fine particles) typically for the connection of fine electrodes in the elements. Examples of known conductive fine particles for these applications include conductive fine particles disclosed in PTL 5. The conductive fine particles each include a fine resin particle and a metal disposed on the entire surface of the fine resinous particle.

Disadvantageously, the conductive fine particles each include a fine resinous particle and a metal disposed on the entire surface of the particle. This configuration requires a large amount of an expensive metal and leads to a high material cost. In addition, there is a need for a special technique such as electroplating technique and alternate adsorption technique to prepare the conductive fine particles. The special technique requires the use of a special apparatus and/or requires a large number of production steps. This disadvantageously leads to high production cost.

In addition, the metal-coated resinous particles are coated with the metal on the entire surface. This configuration causes the particles to be colored. For imparting conductivity to the resulting resin cured product, the conductive fine particles are formulated in a large amount so as to bring the conductive fine particles into contact with each other in the resin cured product. Under these circumstances, it is difficult to inexpensively obtain a cured product that has both transparency and conductivity.

CITATION LIST

Patent Literature

PTL 1: Japanese Unexamined Patent Application Publication (JP-A) No. 2007-046035
PTL 2: JP-A No. 2010-126699
PTL 3: JP-A No. 2010-024364
PTL 4: WO 2012/020688
PTL 5: JP-A No. 2013-186976
PTL 6: JP-A No. 2010-163566

SUMMARY OF INVENTION

Technical Problem

The present invention has an object to provide a curable composition for sealing optical semiconductor element as follows, and to provide a cured product of the curable composition. The curable composition less suffers from or less causes the intrusion and/or evolution of moisture and gases, where the moisture and gases may impair optical semiconductor elements. The curable composition having this configuration contributorily stabilizes the performance of, and prolongs the lifetime of, optical semiconductor elements and optical semiconductor devices. The curable composition has high transparency and offers excellent productivity. The present invention has another object to provide a curable composition for sealing optical semiconductor element as follows, and to provide a cured product of the curable composition. The curable composition and the cured product employ conductive fiber-bearing particles. The use of the conductive fiber-bearing particles allows the curable composition and the cured product to have excellent conductivity (in particular, excellent conductivity in the thickness direction). The present invention has yet another object to provide an optical semiconductor and an optical semiconductor device both of which offer stable performance and have long lifetimes.

Solution to Problem

After intensive investigations to achieve the objects, the inventors have found that an optical semiconductor-use curable composition including a curing catalyst and curable compounds each containing specific functional groups gives a cured product that less suffers from or less causes the intrusion and/or evolution of moisture and gases, where the moisture and gases may impair optical semiconductor elements.

Specifically, the present invention relates to followings.

[1] The present invention relates, in an embodiment, to a curable composition for sealing optical semiconductor. The curable composition includes components (A), (B), and (C) as follows. The component (A) is a compound containing at least one functional group selected from the group consisting of epoxy groups, oxetanyl groups, vinyl ether groups, and (meth)acryloyl groups. The component (B) is a cycloaliphatic epoxy compound. The component (C) is a curing catalyst. The curing catalyst includes a cationic component and an anionic component and generates an acid upon application of light or heat. The cationic component contains three or more aromatic rings. The anionic component contains a central element selected from boron and phosphorus.

[2] The present invention relates, in another embodiment, to a curable composition for sealing optical semiconductor. This curable composition includes components (A), (B), (C), and (D) as follows. The component (A) is a compound containing at least one functional group selected from the group consisting of epoxy groups, oxetanyl groups, vinyl ether groups, and (meth)acryloyl groups. The component (B) is a cycloaliphatic epoxy compound. The component (C) is a curing catalyst. The curing catalyst includes a cationic component and an anionic component and generates an acid upon application of light or heat. The cationic component contains at least one aromatic ring. The anionic component contains a central element selected from boron and phosphorus. The component (D) is conductive fiber-bearing particles. The conductive fiber particles each include a particulate substance and a fibrous conductive substance lying on or over the particulate substance.

[3] The component (A) may include a compound (A1') in the curable composition according to one of [1] and [2] for sealing semiconductor. The compound (A1') contains at least one aromatic ring and contains at least two functional groups selected from the group consisting of epoxy groups, oxetanyl groups, vinyl ether groups, and (meth)acryloyl groups.

[4] The compound (A1') may have a molecular weight of 100 to 10000 in the curable composition according to [3] for sealing semiconductor.

[5] The component (A) may include a compound (A2') in the curable composition according to any one of [1] to [4] for sealing optical semiconductor. The compound (A2') contains at least one aromatic ring, has a molecular weight of 100 to 1000, and contains one functional group selected from the group consisting of epoxy groups, oxetanyl groups, vinyl ether groups, and (meth)acryloyl groups.

[6] The component (B) may be a compound containing two or more cycloaliphatic epoxy groups in the curable composition according to any one of [1] to [5] for sealing optical semiconductor.

[7] The component (B) may have a molecular weight of 100 to 500 in the curable composition according to any one of [1] to [6] for sealing optical semiconductor.

[8] The component (B) may be a compound devoid of ester groups and/or carbonate groups in the curable composition according to any one of [1] to [7] for sealing optical semiconductor.

[9] The component (A) may be a compound containing at least one aromatic ring and containing at least one functional group selected from the group consisting of epoxy groups, oxetanyl groups, vinyl ether groups, and (meth)acryloyl groups, and the component (B) may be a compound selected from cycloaliphatic epoxy compounds (excluding aromatic-ring-containing compounds) in the curable composition according to any one of [1] to [8] for sealing optical semiconductor.

[10] The component (B) in the curable composition according to any one of [1] to [9] for sealing optical semiconductor may be a compound represented by Formula (3):

[Chem. 1]

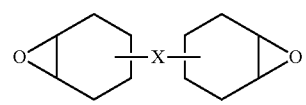

(3)

where X is selected from a single bond and a linkage group.

[11] The curable composition according to any one of [1] to [10] for sealing optical semiconductor may contain the component (B) in a content of 30 to 95 percent by weight based on the total weight (100 percent by weight) of the curable composition and may contain the component (C) in a content of 0.01 to 8 percent by weight based on the total weight (100 percent by weight) of the curable composition.

[12] In the curable composition according to any one of [1] to [11] for sealing optical semiconductor, the cationic component containing at least one aromatic ring in the component (C) may be an aromatic sulfonium salt.

[13] In the curable composition according to any one of [2] to [12] for sealing optical semiconductor, the fibrous conductive substance in the component (D) may be a conductive nanowire.

[14] The conductive nanowire may be at least one conductive nanowire selected from the group consisting of metal nanowires, semiconductor nanowires, carbon fibers, carbon nanotubes, and conductive polymer nanowires, in the curable composition according to [13] for sealing optical semiconductor.

[15] The metal nanowires may be silver nanowires in the curable composition according to [14] for sealing optical semiconductor.

[16] The present invention, in yet another embodiment, relates to a cured product of the curable composition according to any one of [1] to [15] for sealing optical semiconductor.

[17] The cured product according to [16] may have a water vapor permeability of equal to or less than 40 g/m$^2$·day.

[18] In the cured product according to one of [16] and [17], an outgassing amount may be equal to or less than 20 ppm.

[19] In the cured product according to any one of [16] to [18], an acrolein amount may be equal to or less than 3 ppm.

[20] The present invention also relates to an optical semiconductor encapsulated or sealed using the curable composition according to any one of [1] to [15] for sealing optical semiconductor.

[21] The present invention also relates to an optical semiconductor device including the optical semiconductor according to [20].

Advantageous Effects of Invention

Since the curable composition according to the embodiment of the present invention has the configuration, the curable composition can less suffer from or less cause the intrusion and/or evolution of moisture and gases, where the moisture and gases may impair optical semiconductor elements. This allows the optical semiconductor elements and optical semiconductor devices to offer more stable performance and to have longer lifetimes. The configuration can give a curable composition for sealing optical semiconductor element and a cured product of the curable composition, each of which has high transparency and excellent productivity. Accordingly, the curable composition according to the present invention, when used as an sealant, allows the optical semiconductor elements and optical semiconductor devices to offer more stable performance and to have longer lifetimes. The curable composition according to the present invention is advantageously usable as sealants, or sealing sheets or films for the encapsulation of organic electroluminescence elements (in particular, top-emission organic electroluminescence elements).

The organic electroluminescence devices according to the present invention are sealed with any of the curable composition, and the sealing sheet or film derived from the curable composition. This configuration allows the organic electroluminescence devices to have excellent light extraction efficiency (namely, to have excellent luminous efficiency) and to have excellent brightness.

In an embodiment, conductive fiber-bearing particles are used in the curable composition. This configuration can give a curable composition for sealing optical semiconductor element and a cured product of the curable composition, each of which has excellent conductivity (in particular, conductivity in the thickness direction). Assume that, of the conductive fiber-bearing particles for use in the present invention, conductive fiber-bearing particles having flexibility are used in the curable composition. Further assume that the curable composition containing the flexible conductive fiber-bearing particles is shaped into a shape having fine asperities. In this case, the conductive fiber-bearing particles deform so as to conform to the asperity structure and extend even into the fine asperities. This configuration eliminates or minimizes the formation of portions with poor conductivity and can give a cured product that has excellent conducting performance.

BRIEF DESCRIPTION OF DRAWINGS

FIG. 1 illustrates a scanning electron photomicrograph (SEM image) of conductive fiber-bearing particles (conductive fiber-bearing particles for use in the present invention) prepared in Production Example 1.

DESCRIPTION OF EMBODIMENTS

A curable composition according to an embodiment of the present invention for sealing optical semiconductor includes components (A), (B), and (C) as follows.

The component (A) is a compound that contains at least one functional group selected from the group consisting of epoxy groups, oxetanyl groups, vinyl ether groups, and (meth)acryloyl groups.

The component (B) is a cycloaliphatic epoxy compound.

The component (C) is a curing catalyst. The curing catalyst includes a cationic component and an anionic component and generates an acid upon application of light or heat. The cationic component contains three or more aromatic rings. The anionic component contains a central element selected from boron and phosphorus.

A curable composition according to another embodiment of the present invention for sealing optical semiconductor includes components (A), (B), (C) and (D) as follows.

The component (A) is a compound containing at least one functional group selected from the group consisting of epoxy groups, oxetanyl groups, vinyl ether groups, and (meth)acryloyl groups.

The component (B) is a cycloaliphatic epoxy compound.

The component (C) is a curing catalyst. The curing catalyst includes a cationic component and an anionic component and generates an acid upon application of light or heat. The cationic component contains at least one aromatic ring. The anionic component contains a central element selected from boron and phosphorus.

The component (D) is conductive fiber-bearing particles. The conductive fiber-bearing particles each include a particulate substance and a fibrous conductive substance lying on or over the particulate substance.

The component (A) may be selected from compounds each containing at least one functional group selected from the group consisting of epoxy groups, oxetanyl groups, vinyl ether groups, and (meth)acryloyl groups, excluding compounds corresponding to the component (B). The component (A) may be selected from compounds each containing at least one aromatic ring and at least one functional group selected from the group consisting of epoxy groups, oxetanyl groups, vinyl ether groups, and (meth)acryloyl groups, and the component (B) may be selected from cycloaliphatic epoxy compounds excluding aromatic-ring-containing compounds.

Curable compounds for use in the present invention are compounds that cure upon application of light or heat and are not limited, as long as including the component (A) and the component (B). The curable compounds may further include one or more curable compounds in addition to the component (A) and the component (B) within ranges not adversely affecting the advantageous effects of the present invention.

Component (A)

The component (A) is not limited, as long as being a compound that contains at least one functional group selected from the group consisting of epoxy groups, oxetane groups, vinyl ether groups, and (meth)acryloyl groups. The compound as the component (A) may have the functional group or groups in the number not critical. However, the component (A) generally preferably includes a compound (A1) containing at least two functional groups selected from the group consisting of epoxy groups, oxetanyl groups, vinyl ether groups, and (meth)acryloyl groups, as described in WO 2012/020688 (PTL 4). For low permeability and high gas-barrier properties, the component (A) more preferably includes a compound (A2) in combination with the compound (A1). The compound (A2) refers to a compound that has a molecular weight of 100 to 1000 and contains one functional group selected from the group consisting of epoxy groups, oxetanyl groups, vinyl ether groups, and (meth)acryloyl groups. Assume that such a compound contains two or more functional groups selected from the group consisting of epoxy groups, oxetane groups, vinyl ether groups, and (meth)acryloyl groups per molecule. In this case, the two or more functional groups may be identical to, or different from, one another.

The component (A) preferably, but not limitatively, contains a cyclic skeleton. Examples of the cyclic skeleton include aliphatic cyclic skeletons and aromatic cyclic skeletons. The cyclic skeletons may be identical to, or different from, each other. Assume that the component (A) contains two or more cyclic skeletons per molecule. In this case, the two or more cyclic skeletons may be identical to, or different from, each other.

Specifically, examples of the cyclic skeleton include, but are not limited to, monocyclic or fused-polycyclic aromatic rings such as benzene ring, naphthalene ring, anthracene ring, phenanthrene ring, and fluorene ring; and monocyclic or polycyclic aliphatic rings such as cyclopentane ring, cyclohexane ring, decahydronaphthalene ring, norbornane ring, and adamantane ring. Assume that a polycyclic cyclic skeleton is formed typically by fusion of rings in the number of n ("n" rings). In this case, the number of cyclic skeletons is defined as "n" in the present description. The component (A) may contain cyclic skeleton(s) in the number per molecule of typically 1 to 30, preferably 1 to 10, more preferably 1 to 6, and furthermore preferably 1 to 5.

The curable composition may contain the component (A) in a content of preferably 5 to 80 percent by weight, more preferably 10 to 70 percent by weight, and furthermore preferably 20 to 60 percent by weight, based on the total weight (100 percent by weight) of the curable compounds for use in the present invention. The range is preferred typically from the viewpoints of low moisture permeability, high gas-barrier properties, curable composition coatability, and cured product hardness. In particular, the content is preferably 10 to 70 percent by weight, and more preferably 20 to 60 percent by weight from the viewpoint of outgassing restrainment.

Compound (A1)

The compound (A1) is a compound that contains at least two functional groups selected from the group consisting of epoxy groups, oxetanyl groups, vinyl ether groups, and (meth)acryloyl groups. The epoxy groups, oxetanyl groups, and vinyl ether groups belong to cationically polymerizable functional groups. The (meth)acryloyl groups belong to radically polymerizable functional groups. Of the functional groups, epoxy groups are preferred, of which glycidyl group is particularly preferred. The compound (A1) may contain the functional groups in the number per molecule of typically 2 to 30, preferably 2 to 10, more preferably 2 to 6, and furthermore preferably 2 or 3. The two or more functional groups may be identical to, or different from, each other. The compound (A1) may have a molecular weight not critical, but preferably 100 to 10000, more preferably 150 to 5000, and furthermore preferably 200 to 1000. The component (A) may include each of different compounds (A1) alone or in combination.

Examples of the compound (A1) include, but are not limited to, compounds (A1-1) each containing at least one aromatic ring and two or more cationically polymerizable functional groups per molecule; and compounds (A1-2) each containing at least one aromatic ring and two or more radically polymerizable functional groups per molecule.

The compounds (A1-1) each contain at least one aromatic ring and two or more cationically polymerizable functional groups per molecule. Examples of the compounds (A1-1) include, but are not limited to, compounds each containing two epoxy groups and at least one benzene ring, such as biphenol diglycidyl ether, bisphenol-A diglycidyl ether, bisphenol-F diglycidyl ether, bisphenol-S diglycidyl ether, and tetramethylbiphenol diglycidyl ether; compounds each containing a fused ring and two epoxy groups, such as naphthalenediol diglycidyl ether, bisphenolfluorene diglycidyl ether, biscresolfluorene diglycidyl ether, and bisphenoxyethanolfluorene diglycidyl ether; compounds each containing two or more epoxy groups and at least one of a benzene ring and a fused ring, including polyphenyl glycidyl ethers containing a constitutional repeating unit, such as phenol novolac epoxy resins, cresol novolac epoxy resins, biphenylskeleton-containing novolac epoxy resins, and naphthalene-skeleton-containing novolac epoxy resins; compounds each containing two oxetanyl groups and at least one aromatic ring, such as bisphenol-F bis(3-ethyloxetan-3-ylmethyl) ether; compounds each containing two vinyl ether groups and at least one benzene ring, such as biphenol divinyl ether, bisphenol-A divinyl ether, bisphenol-F divinyl ether, bisphenol-F bis(2-vinyloxyethyl) ether, bisphenol-S divinyl ether, and tetramethylbiphenol divinyl ether; compounds each containing a fused ring and two vinyl ether groups, such as naphthalenediol divinyl ether, bisphenolfluorene divinyl ether, biscresolfluorene divinyl ether, and bisphenoxyethanolfluorene divinyl ether; and halides of these compounds, and ($C_1$-$C_9$ alkyl)-substituted derivatives of them. Examples of the $C_1$-$C_9$ alkyl substituents in the ($C_1$-$C_9$ alkyl)-substituted derivatives include, but are not limited to, methyl, ethyl, propyl, and t-butyl groups. Examples of the halogens in the halides include, but are not limited to, F, Cl, and Br.

The compounds (A1-2) each contain at least one aromatic ring and two or more radically polymerizable functional groups per molecule. Examples of the compounds (A1-2) include, but are not limited to, compounds each containing two (meth)acryloyl groups and at least one benzene ring, such as biphenol di(meth)acrylate, bisphenol-A di(meth) acrylate, bisphenol-F di(meth)acrylate, bisphenol-S di(meth)acrylate, and tetramethylbiphenol di(meth)acrylate; compounds each containing a fused ring and two (meth)acryloyl groups, such as naphthalenediol di(meth)acrylate, biphenolfluorene di(meth)acrylate, biscresolfluorene di(meth)acrylate, and bisphenoxyethanolfluorene di(meth)acrylate; and halides of these compounds, and ($C_1$-$C_9$ alkyl)-substituted derivatives of them. Examples of the $C_1$-$C_9$ alkyl substituents in the ($C_1$-$C_9$ alkyl)-substituted derivatives include, but are not limited to, methyl, ethyl, propyl, and t-butyl groups. Examples of the halogens in the halides include, but are not limited to, F, Cl, and Br.

Examples of the compound (A1) include, but are not limited to, compounds represented by Formula (1):

[Chem. 2]

$$Z^1\text{\textendash}(\text{\textendash O\textendash R}^1), \quad (1)$$

where $Z^1$ represents a group corresponding to a m-valent polyhydroxy compound ($Z^1$(OH)m), except for removing OH group in the number of m from the compound; $R^1$ is selected from a glycidyl group, an optionally substituted oxetanyl group, a vinyl group, and a (meth)acryloyl group; and m represents an integer of equal to or more than 2. The group $Z^1$ is preferably a group containing a cyclic skeleton. Examples of the cyclic skeleton include those exemplified above.

Examples of the m-valent polyhydroxy compound $Z^1$(OH)m include, but are not limited to, compounds each containing two benzene rings, such as biphenol, bisphenol-A, bisphenol-F, and bisphenol-S, halides of these compounds, and ($C_1$-$C_9$ alkyl)-substituted derivatives of them; compounds each containing a fused ring, such as naphthalenediol, bisphenolfluorene, biscresolfluorene, and bisphenoxyethanolfluorene, halides of these compounds, and ($C_1$-$C_9$ alkyl)-substituted derivatives of them; and such as hydrogenated bisphenol-A, hydrogenated bisphenol-F, hydrogenated bisphenol-S, and dicyclohexyl, halides of these compounds, and ($C_1$-$C_9$ alkyl)-substituted derivatives of them. Examples of the $C_1$-$C_9$ alkyl substituents in the ($C_1$-$C_9$ alkyl)-substituted derivatives include, but are not limited to, methyl, ethyl, propyl, and t-butyl groups. Examples of the halogens in the halides include, but are not limited to, F, Cl, and Br.

Of the compounds (A1), preferred are compounds each containing two functional groups selected from the group consisting of epoxy groups, oxetane groups, vinyl ether groups, and (meth)acryloyl groups in combination with two benzene rings or two cyclohexane rings. Specifically, preferred examples of the compounds (A1) include, but are not limited to, diglycidyl ethers each containing two to four benzene rings, such as bisphenol-F diglycidyl ether, tetramethylbiphenol diglycidyl ether, and bisphenoxyethanolfluorene diglycidyl ether; dioxetanyl ethers each containing two to four benzene rings, such as bisphenol-F bis(3-ethyloxetan-3-ylmethyl) ether; divinyl ethers each containing two to four benzene rings, such as bisphenol-F divinyl ether; and (meth)acrylates each containing two to four benzene rings, such as bisphenol-F di(meth)acrylate. Of the compounds (A1), particularly preferred are compounds each containing two glycidyl groups and two benzene rings.

Accordingly, of the compounds (A1), preferred are compounds (A1') each containing at least one aromatic ring and at least two functional groups selected from the group consisting of epoxy groups, oxetanyl groups, vinyl ether groups, and (meth)acryloyl groups.

The compound (A1) (including the compound (A1')) may each have a molecular weight of preferably 100 to 10000, more preferably 200 to 1000, and furthermore preferably 300 to 500. This is preferred from the viewpoints typically of low moisture permeability, high gas-barrier properties, and curable composition coatability.

The compound(s) (A1) may be contained in a content of preferably 5 to 80 percent by weight, more preferably 7 to 60 percent by weight, and furthermore preferably 10 to 50 percent by weight, based on the total weight (100 percent by weight) of the curable compounds for use in the present invention. This is preferred from the viewpoints typically of low moisture permeability, high gas-barrier properties, curable composition coatability, and cured product hardness. Particularly from the viewpoint of outgassing restrainment, the content is preferably 5 to 60 percent by weight, more preferably 7 to 50 percent by weight, and furthermore preferably 10 to 45 percent by weight.

Compound (A2)

The compound (A2) is a compound that contains one functional group selected from the group consisting of epoxy groups, oxetane groups, vinyl ether groups, and (meth)acryloyl groups per molecule and has a molecular weight of 100 to 1000. The compound (A2), as having a molecular weight of 100 to 1000, may constitute a side chain of the resulting polymer (cured product) upon curing of the curable composition and may pack the free volume in the cured product. This configuration may effectively contribute to low moisture permeability and high gas-barrier properties. Examples of the cyclic skeleton in the compound (A2) include, but are not limited to, those exemplified in the compound (A1). Among them, benzene ring and cyclohexane ring are preferred. The component (A) may include each of different compounds (A2) alone or in combination.

Assume that the component (A) includes both the compound (A1) and the compound (A2). In this case, when the compound (A1) contains a cationically polymerizable functional group(s), the compound (A2) preferably also contains a cationically polymerizable functional group(s). When the compound (A1) contains a radically polymerizable functional group(s), the compound (A2) also preferably contains a radically polymerizable functional group(s). As the cationic functional group(s), preferred are epoxy groups (of which glycidyl group is particularly proffered) both in the compound (A1) and in the compound (A2).

Examples of the compound (A2) include, but are not limited to, compounds (A2-1) that contain an aromatic ring and a cationically polymerizable functional group; compounds (A2-2) that contain an aromatic ring and a radically polymerizable functional group; compounds (A2-3) that contain an aliphatic ring and a cationically polymerizable functional group; compounds (A2-4) that contain an aliphatic ring and a radically polymerizable functional group; compounds (A2-5) that contain an alkyl group and a cationically polymerizable functional group; and compounds (A2-6) that contain an alkyl group and a radically polymerizable functional group.

The compounds (A2-1) each contain an aromatic ring and a cationically polymerizable functional group. Examples of the compounds (A2-1) include, but are not limited to, compounds each containing a phenol skeleton and an epoxy group, such as glycidyl phenyl ether, o-, m-, and p-phenylphenol glycidyl ethers, 2,3-, 2,4-, 2,5-, 2,6-, 3,4-, and 3,5-diphenylphenol glycidyl ethers, 2-phenyl-4-benzylphenylphenol glycidyl ether, 2-phenyl-5-benzylphenylphenol glycidyl ether, 2-phenyl-6-benzylphenylphenol glycidyl ether, 3-phenyl-5-benzylphenylphenol glycidyl ether, 3-phenyl-6-benzylphenylphenol glycidyl ether, 4-phenyl-2-benzylphenylphenol glycidyl ether, triphenylphenol glycidyl ethers, diphenylbenzylphenol glycidyl ethers, phenylbenzyl-phenol glycidyl ethers, and tribenzylphenol glycidyl ethers; compounds each containing an epoxy group and corresponding to the above compounds, except for replacing the phenol skeleton with a skeleton selected from the group consisting of phenoxyethanol skeletons, phenoxypropanol skeletons, and phenoxydibutanol skeletons, such as 2-(2,6-diphenylphenoxy)ethanol glycidyl ether; compounds each containing an alkyl-substituted benzene ring and an epoxy group, such as glycidyl methylphenyl ether, glycidyl ethylphenyl ether, glycidyl propylphenyl ether, glycidyl n-butylphenyl ether, and glycidyl t-butylphenyl ether, of which compounds each containing a ($C_1$-$C_9$ alkyl)-substituted benzene ring and an epoxy group are typified; alkyl-substituted phenylphenol glycidyl ethers such as methylphenylphenol glycidyl ether, ethylphenylphenol glycidyl ether, propylphenylphenol glycidyl ether, n-butylphenylphenol glycidyl ether, and t-butylphenylphenol glycidyl ether, of which ($C_1$-$C_9$ alkyl)-substituted phenol glycidyl ethers are typified; benzyl glycidyl ether compounds such as benzyl (R)-(−)-glycidyl ether and phenylbenzyl glycidyl ethers; vinyl ether compounds each containing one or two benzene rings, such as phenyl vinyl ether, phenylphenol vinyl ethers, phenoxymethyl vinyl ether, (phenylphenoxy)methyl vinyl ethers, (2-phenylphenoxy)ethyl vinyl ethers, and (2-phenylphenoxy)ethyl vinyl ethers; oxetane compounds each containing one or two benzene rings, such as phenyloxetanes, phenylphenoloxetanes, phenoxymethyloxetanes, (phenylphenoxy)methyloxetanes, (2-phenoxy)ethyloxetanes, and (2-phenylphenoxy)ethyloxetanes; and halides of these compounds. Examples of the $C_1$-$C_9$ alkyl substituents include, but are not limited to, methyl, ethyl, propyl, and t-butyl groups.

The compounds (A2-2) each contain an aromatic ring and a radically polymerizable functional group. Examples of the compounds (A2-2) include, but are not limited to, compounds each containing one or two benzene rings and a (meth)acryloyl group, such as phenyl (meth)acrylate, phenylphenol (meth)acrylate, phenoxymethyl (meth)acrylate, (phenylphenoxy)methyl (meth)acrylate, (2-phenoxy)ethyl (meth)acrylate, and (2-phenylphenoxy)ethyl (meth)acrylate; and halides of these compounds, and ($C_1$-$C_9$ alkyl)-substituted derivatives of them. Examples of the $C_1$-$C_9$ alkyl substituents in the ($C_1$-$C_9$ alkyl)-substituted derivatives include, but are not limited to, methyl, ethyl, propyl, and t-butyl groups. Examples of the halogens in the halides include, but are not limited to, F, Cl, and Br.

The compounds (A2-3) each contain an aliphatic ring and a cationically polymerizable functional group. Examples of the compounds (A2-3) include, but are not limited to, $C_5$-$C_{20}$ cycloalkyl glycidyl ether compounds such as cyclohexyl glycidyl ether, dicyclohexyl glycidyl ether, and tricyclohexyl glycidyl ether; $C_5$-$C_{20}$ cycloalkyl oxetanyl ether compounds such as cyclohexyl oxetanyl ether, dicyclohexyl oxetanyl ether, and tricyclohexyl oxetanyl ether; $C_5$-$C_{20}$ cycloalkyl vinyl ether compounds such as cyclohexyl vinyl ether, dicyclohexyl vinyl ether, and tricyclohexyl vinyl ether.

The compounds (A2-4) each contain an aliphatic ring and a radically polymerizable functional group. Examples of the compounds (A2-4) include, but are not limited to, $C_5$-$C_{20}$ cycloalkyl (meth)acrylate compounds such as cyclohexyl (meth)acrylate, dicyclohexyl (meth)acrylate, and tricyclohexyl (meth)acrylate.

The compounds (A2-5) each contain an alkyl group and a cationically polymerizable functional group. Examples of the compounds (A2-5) include, but are not limited to, $C_1$-$C_9$ alkyl glycidyl ether compounds such as glycidyl methyl ether, glycidyl ethyl ether, propyl glycidyl ether, butyl glycidyl ether, and 2-ethylhexyl glycidyl ether; $C_1$-$C_9$ alkyl oxetanyl ether compounds such as methyl oxetanyl ether, ethyl oxetanyl ether, propyl oxetanyl ether, and butyl oxetanyl ether; and $C_1$-$C_9$ alkyl vinyl ether compounds such as methyl vinyl ether, ethyl vinyl ether, propyl vinyl ether, and butyl vinyl ether.

The compounds (A2-6) each contain an alkyl group and a radically polymerizable functional group. Examples of the compounds (A2-6) include, but are not limited to, $C_1$-$C_9$ alkyl (meth)acrylate compounds such as methyl (meth)acrylate, ethyl (meth)acrylate, propyl (meth)acrylate, and butyl (meth)acrylate.

Examples of the compound (A2) include, but are not limited to, compounds represented by Formula (2):

[Chem. 3]

$$Z^2\text{—}O\text{—}R^2 \quad (2)$$

where $Z^2$ represents a group corresponding to a monovalent hydroxy compound ($Z^2OH$), except for removing one OH group from the compound; and $R^2$ is as with $R^1$. The group $Z^2$ is preferably a group containing a cyclic skeleton. Examples of the cyclic skeleton include, but are not limited to, those exemplified above.

Examples of the hydroxy compound $Z^2OH$ include, but are not limited to, phenols containing one to three benzene rings, such as phenol, phenylphenols, diphenylphenols, and triphenylphenols; alkyl-substituted phenols such as methylphenols, ethylphenols, propylphenols, n-butylphenols, and t-butylphenols, of which ($C_1$-$C_9$ alkyl)-substituted phenols are typified; alkyl-substituted phenyl-phenols such as methylphenylphenols, ethylphenylphenols, propylphenylphenols, n-butylphenylphenols, and t-butylphenylphenols, of which ($C_1$-$C_9$ alkyl)-substituted phenyl-phenols are typified; alkyl alcohols such as methyl alcohol, ethyl alcohol, propyl alcohol, and butyl alcohol, of which $C_1$-$C_9$ alkyl alcohols are typified; benzyl alcohols such as benzyl alcohol and phenylbenzyl alcohols; alcohols each containing an aliphatic ring, such as cyclohexyl alcohol, dicyclohexyl alcohol, and tricyclohexyl alcohol; and halides of them. Examples of the $C_1$-$C_9$ alkyl substituents include, but are not limited to, methyl, ethyl, propyl, and t-butyl groups. Examples of the halogens in the halides include, but are not limited to, F, Cl, and Br.

The compound (A2) is preferably selected from compounds each containing one functional group selected from the group consisting of epoxy groups, oxetane groups, vinyl ether groups, and (meth)acryloyl groups and containing a benzene ring or cyclohexane ring. Specifically, preferred examples of the compound (A2) include, but are not limited to, glycidyl ethers each containing one or two benzene rings, such as glycidyl phenyl ether and o-phenylphenol glycidyl ether; and (meth)acrylates each containing one or two benzene rings, such as 2-(phenylphenoxy)ethyl (meth)acrylate.

The compound (A2) is preferably a compound (A2'). The compound (A2') contains an aromatic ring, has a molecular weight of 100 to 1000, and contains one functional group selected from the group consisting of epoxy groups, oxetanyl groups, vinyl ether groups, and (meth)acryloyl groups.

The compound (A2) may have a molecular weight of preferably 100 to 1000, more preferably 150 to 800, furthermore preferably 170 to 600, and particularly preferably 200 to 400. This is preferred from the viewpoints typically of low moisture permeability, high gas-barrier properties, and curable composition coatability.

The compound (A2) may be contained in a proportion of preferably 0 to 1400 parts by weight, more preferably 70 to 850 parts by weight, and furthermore preferably 100 to 500 parts by weight, per 100 parts by weight of the total weight of the compound (A1). This is preferred from the viewpoints typically of low moisture permeability, high gas-barrier properties, and curable composition coatability.

The compound (A2) may be contained in a content of preferably 0 to 70 percent by weight, more preferably 5 to 60 percent by weight, and furthermore preferably 10 to 50 percent by weight, based on the total weight (100 percent by weight) of the curable compounds for use in the present invention.

Preferred examples of the combination of the compound (A1) and the compound (A2) include, but are not limited to, a combination in which the compound (A1) contains two cyclic skeletons, and the compound (A2) contains one cyclic skeleton; a combination in which the compound (A1) contains two cyclic skeletons, and the compound (A2) contains two cyclic skeletons; and a combination in which the compound (A1) contains five cyclic skeletons, and the compound (A2) contains one cyclic skeleton. These combinations are preferred from the viewpoints typically of low moisture permeability and high gas-barrier properties.

Specifically, preferred examples of the combination of the compound (A1) and the compound (A2) include, but are not limited to, a combination of bisphenol-F diglycidyl ether and glycidyl phenyl ether; and a combination of bisphenol-F diglycidyl ether and o-, m-, or p-phenylphenol glycidyl ether. Assume that the combination of bisphenol-F diglycidyl ether and glycidyl phenyl ether is employed. In this case, glycidyl phenyl ether as the compound (A2) may be contained in a proportion of preferably 1 to 100 parts by weight per 100 parts by weight of bisphenol-F diglycidyl ether as the compound (A1). Assume that the combination of bisphenol-F diglycidyl ether and o-, m-, or p-phenylphenol glycidyl ether is employed. In this case, o-, m-, or p-phenylphenol glycidyl ether as the compound (A2) may be contained in a proportion of preferably 1 to 1000 parts by weight per 100 parts by weight of bisphenol-F diglycidyl ether as the compound (A1).

The curable compounds for use in the present invention may include at least one of the compound (A1) and the compound (A2) in a total content of preferably 5 to 80 percent by weight, more preferably 10 to 70 percent by weight, and furthermore preferably 20 to 60 percent by weight, based on the total weight (100 percent by weight) of the curable compounds.

Component (B)

The component (B) is a cycloaliphatic epoxy compound, namely, a compound that contains an aliphatic ring (aliphatic hydrocarbon ring) structure and an epoxy group in molecule (per molecule). The curable composition according to the present invention may include, as the component (B), each of different cycloaliphatic epoxy compounds alone or in combination.

Examples of the component (B) include, but are not limited to, compounds (B-1) each containing two or more cationically polymerizable functional groups and an aliphatic ring per molecule; and compounds (B-2) each containing two or more radically polymerizable functional groups and an aliphatic ring per molecule.

Examples of the compounds (B-1) include, but are not limited to, compounds each containing a cyclohexane ring and two epoxy groups, such as hydrogenated bisphenol-A diglycidyl ether, hydrogenated bisphenol-F diglycidyl ether, hydrogenated bisphenol-S diglycidyl ether, dicyclohexyl diglycidyl ether, bis(3,4-epoxycyclohexyl)methyl, and (3,4, 3',4'-diepoxy)bicyclohexyl; compounds each containing a cyclohexane ring and two oxetane groups; and compounds each containing a cyclohexane ring and two vinyl ether groups, such as hydrogenated bisphenol-A divinyl ether, hydrogenated bisphenol-F divinyl ether, hydrogenated bisphenol-S divinyl ether, and dicyclohexyl divinyl ether.

Examples of the compounds (B-2) include, but are not limited to, compounds each containing a cyclohexane ring and two (meth)acryloyl groups, such as hydrogenated bisphenol-A di(meth)acrylate, hydrogenated bisphenol-F di(meth)acrylate, hydrogenated bisphenol-S di(meth)acrylate, and dicyclohexyl di(meth)acrylate.

More specifically, examples of the compounds (B-1) include, but are not limited to, compounds (i) each containing a cycloaliphatic epoxy group, where the cycloaliphatic epoxy group is an epoxy group including an oxygen atom and adjacent two carbon atoms that constitute an aliphatic ring; compounds (ii) each containing an aliphatic ring and an epoxy group directly bonded to the aliphatic ring via a single bond; and compounds (iii) each containing an aliphatic ring and a glycidyl group.

The compounds (i) each contain an epoxy group including an oxygen atom and adjacent two carbon atoms that constitute an aliphatic ring. The compounds (i) may be optionally selected from known or common ones. In particular, compounds each containing cyclohexene oxide group as the cycloaliphatic epoxy group are preferred.

The compounds (i) contain an epoxy group including an oxygen atom and adjacent two carbon atoms that constitute an aliphatic ring. Of the compounds (i), preferred are compounds each containing a cyclohexene oxide group, of which compounds (alicyclic epoxy compounds) represented by Formula (3) are more preferred. These compounds are preferred from the viewpoints of transparency and heat resistance. Formula (3) is expressed as follows:

[Chem. 4]

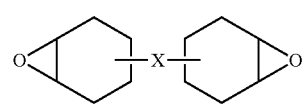

(3)

In Formula (3), X is selected from a single bond and a linkage group (divalent group containing one or more atoms). Examples of the linkage group include, but are not limited to, divalent hydrocarbon groups, carbonyl group, ether bond, ester bond, carbonate group, amido group, and groups each including two or more of them linked to each other.

Examples of compounds of Formula (3) in which X is a single bond include, but are not limited to, (2,3,2',3'-diepoxy)bicyclohexyl, (2,3,3',4'-diepoxy)bicyclohexyl, and (3,4, 3',4'-diepoxy)bicyclohexyl. Among them, (3,4,3',4'-diepoxy)bicyclohexyl is preferred.

Examples of the divalent hydrocarbon groups include, but are not limited to, $C_1$-$C_{18}$ straight- or branched-chain alkylene groups and divalent alicyclic hydrocarbon groups. Examples of the $C_1$-$C_{18}$ straight- or branched-chain alkylene groups include, but are not limited to, methylene group, methylmethylene group, dimethylmethylene group, ethylene group, propylene group, and trimethylene group. Examples of the divalent alicyclic hydrocarbon groups include, but are not limited to, divalent cycloalkylidene groups (including cycloalkydene groups) such as 1,2-cyclopentylene group, 1,3-cyclopentylene group, cyclopentylidene group, 1,2-cyclohexylene group, 1,3-cyclohexylene group, 1,4-cyclohexylene group, and cyclohexylidene group.

Examples of the linkage group X include oxygen-containing linkage groups. Specifically, examples of the linkage group X include —CO—, —O—CO—O—, —COO—, —O—, —CONH—; groups each including two or more of these groups linked to each other; and groups each including one or more of these groups and one or more of divalent hydrocarbon groups linked to each other. Examples of the divalent hydrocarbon groups include those exemplified above.

Typical examples of the alicyclic epoxy compounds represented by Formula (3) include, but are not limited to, compounds represented by Formulae (3-1) to (3-10) below. Among them, particularly preferred is the compound represented by Formula (3-1) [3,4-epoxycyclohexylmethyl (3,4-epoxy)cyclohexanecarboxylate]. This compound may be available typically under the trade name of CELLOXIDE 2021P from Daicel Corporation. In Formulae (3-5) and (3-7), p and q each independently represent an integer of 1 to 30. In Formula (3-5), $R^3$ represents a $C_1$-$C_8$ alkylene group. Examples of the $C_1$-$C_8$ alkylene group include, but are not limited to, straight- or branched-chain alkylene groups such as methylene group, ethylene group, propylene group, isopropylene group, butylene group, isobutylene group, s-butylene group, pentylene group, hexylene group, heptylene group, and octylene group. Among them, preferred are $C_1$-$C_3$ straight- or branched-chain alkylene groups such as methylene group, ethylene group, propylene group, and isopropylene group. In Formulae (3-9) and (3-10), n1 to n6 each independently represent an integer of 1 to 30.

[Chem. 5]

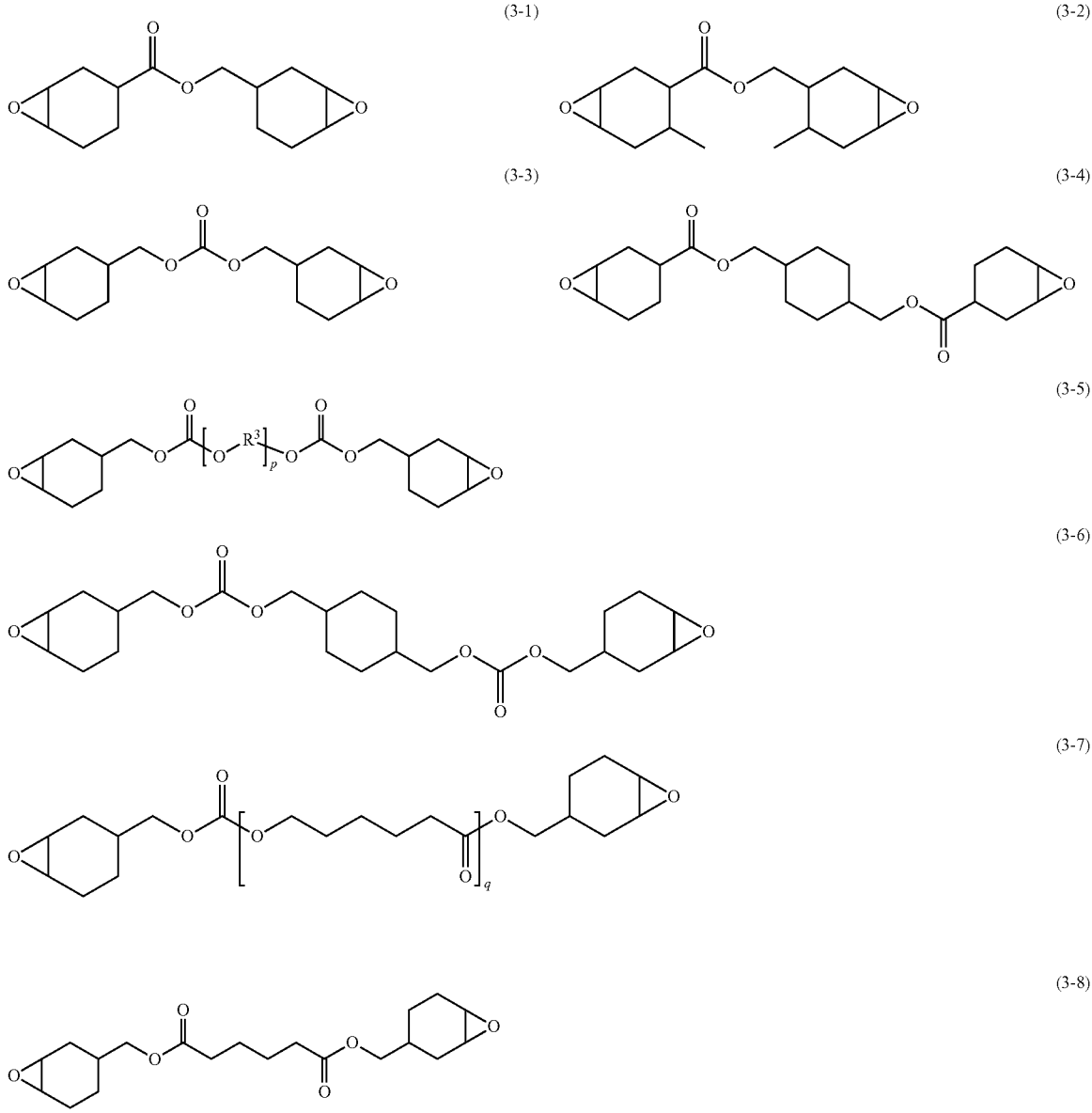

[Chem. 6]

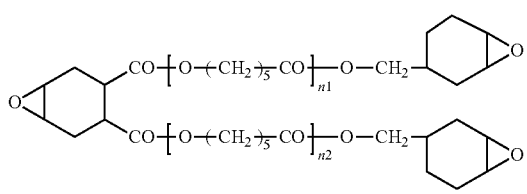

(3-9)

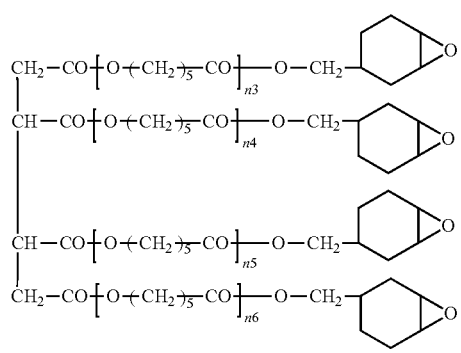

(3-10)

In addition to the compounds represented by Formulae (3-1) to (3-10), examples of the alicyclic epoxy compounds represented by Formula (3) include, but are not limited to, bis(3,4-epoxycyclohexylmethyl) ether, 2,2-bis(3,4-epoxycyclohexyl)propane, and 1,2-bis(3,4-epoxycyclohexyl)ethane.

The compounds (ii) each contain an aliphatic ring and an epoxy group directly bonded to the aliphatic ring via a single bond. Examples of the compounds (ii) include, but are not limited to, compounds represented by Formula (4):

[Chem. 7]

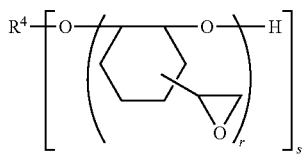

(4)

In Formula (4), $R^4$ represents a group corresponding to a "s"-hydric alcohol, except for removing —OH in a number of "s" from the alcohol; and s and r each independently represent a natural number. Examples of the "s"-hydric alcohol [$R^4$—(OH)s] include, but are not limited to, polyhydric alcohols such as 2,2-bis(hydroxymethyl)-1-butanol, of which $C_1$-$C_{15}$ alcohols are typified. The number s is preferably 1 to 6, and the number r is preferably 1 to 30. Assume that s is equal to or more than 2. In this case, two or more occurrences of r indicating the number of the group in the parentheses may be identical or different. Specifically, a non-limiting example of the compounds represented by Formula (4) is 1,2-epoxy-4-(2-oxiranyl)cyclohexane adduct of 2,2-bis(hydroxymethyl)-1-butanol. This compound may be available typically under the trade name of EHPE3150 from Daicel Corporation.

The compounds (iii) each contain an aliphatic ring and a glycidyl group. Examples of the compounds (iii) include, but are not limited to, hydrogenated bisphenol-A epoxy compounds such as 2,2-bis[4-(2,3-epoxypropoxy)cyclohexyl]propane and 2,2-bis[3,5-dimethyl-4-(2,3-epoxypropoxy)cyclohexyl]propane, where the hydrogenated bisphenol-A epoxy compounds are compounds derived from bisphenol-A epoxy compounds via hydrogenation; hydrogenated bisphenol-F epoxy compounds such as bis[o,o-(2,3-epoxypropoxy)cyclohexyl]methane, bis[o,p-(2,3-epoxypropoxy)cyclohexyl]methane, bis[p,p-(2,3-epoxypropoxy)cyclohexyl]methane, and bis[3,5-dimethyl-4-(2,3-epoxypropoxy)cyclohexyl]methane, where the hydrogenated bisphenol-F epoxy compounds are compounds derived from bisphenol-F epoxy compounds via hydrogenation; hydrogenated biphenol epoxy compounds; hydrogenated phenol novolac epoxy compounds; hydrogenated cresol novolac epoxy compounds; hydrogenated bisphenol-A cresol novolac epoxy compounds; hydrogenated naphthalene epoxy compounds; and hydrogenated aromatic glycidyl ether epoxy compounds such as hydrogenated epoxy compounds obtained by hydrogenation of epoxy compounds derived from trisphenolmethane.

The component (B) may have a molecular weight of preferably 100 to 500, more preferably 150 to 400, and furthermore preferably 180 to 300. This is preferred from the viewpoints typically of curable composition curing rate, curable composition coatability, and outgassing restrainment.

Among them, the component (B) is most preferably a compound that contains two or more cycloaliphatic epoxy groups per molecule and has a molecular weight of 100 to 500.

The component (B) is preferably such that the content of compounds each containing an ester group and/or a carbonate group is equal to or less than 30 percent by weight based on the total weight (100 percent by weight) of the curable compounds. More preferably, the component (B) is selected from compounds devoid of ester groups and/or carbonate groups. These configurations are preferred for the component (B) to less affect the catalytic activity of the the component (C), i.e., the curing catalyst.

The component (B) may be contained in a content of preferably 20 to 95 percent by weight, more preferably 30 to 90 percent by weight, and furthermore preferably 40 to 80 percent by weight, based on the total weight (100 percent by weight) of the curable compounds for use in the present invention. This is preferred for allowing the cured product to surely have properties such as heat resistance, light resistance (lightfastness), thermal shock resistance, and reflow resistance after moisture absorption. The component (B) may be contained in a content of 5 to 80 percent by weight, more preferably 10 to 70 percent by weight, and furthermore preferably 20 to 60 percent by weight, based on the total weight (100 percent by weight) of the curable composition according to the present invention. This is preferred from the viewpoints typically of curable composition curing rate, curable composition coatability, and outgassing restrainment.

Component (C)

In an embodiment, the component (C) for use in the present invention may be a curing catalyst as follows. This curing catalyst includes a cationic component and an anionic component and generates an acid upon application of light or heat. The cationic component contains at least one aromatic ring. The anionic component contains a central element selected from boron and phosphorus. In another embodiment, the component (C) may be a curing catalyst as follows. This curing catalyst includes a cationic component and an anionic component and generates an acid upon application of light or heat. The cationic component contains three or more aromatic rings. The anionic component contains a central element selected from boron and phosphorus.

The cationic component preferably, but not limitatively, contains three or more aromatic rings, more preferably contains four or more aromatic rings, and furthermore preferably contains five or more aromatic rings. This is preferred from the viewpoint of curing catalyst catalytic activity. Examples of the aromatic rings include, but are not limited to, monovalent or divalent phenyl groups, naphthyl group, and anthryl group. The aromatic rings may each have one or more substituents. Examples of the substituents include, but are not limited to, straight- or branched chain $C_1$-$C_{12}$ alkyl groups, straight- or branched chain $C_1$-$C_{12}$ alkoxy groups, halogen atoms, —OH group, —COOH group, and straight- or branched chain $C_1$-$C_{12}$ alkyl ester groups. Examples of the cationic component include, but are not limited to, aromatic diazonium salts, aromatic iodonium salts, aromatic sulfonium salts, aromatic phosphonium salts, aromatic selenium salts, aromatic oxonium salts, and aromatic ammonium salts. Among them, the cationic component is preferably selected from aromatic sulfonium salts, for allowing the curable composition to give a cured product with excellent curability.

The anionic component preferably, but not limitatively, contains three or more aromatic rings, more preferably contains four or more aromatic rings, and furthermore preferably contains five or more aromatic rings. This is preferred from the viewpoint of curing catalyst catalytic activity. Examples of the aromatic rings include, but are not limited to, $C_6$-$C_{30}$ aromatic groups each having one or more halogen substituents. Examples of the aromatic rings include, but are not limited to, phenyl group, naphthyl group, and anthryl group. Examples of the halogen substituents include, but are not limited to, chlorine and fluorine. Examples of the aromatic rings include, but are not limited to, pentafluorophenyl group, 2-(trifluoromethyl)phenyl group, 3-(trifluoromethyl)phenyl group, 4-(trifluoromethyl)phenyl group, 2,3-di(trifluoromethyl)phenyl group, 2,4-di(trifluoromethyl)phenyl group, 2,5-di(trifluoromethyl)phenyl group, 2,6-di(trifluoromethyl)phenyl group, 3,4-di(trifluoromethyl)phenyl group, and 3,5-di(trifluoromethyl)phenyl group.

The anionic component preferably, but not limitatively, contains a central element selected from boron and phosphorus. This is preferred from the viewpoint of curing catalyst catalytic activity. Preferred examples of the anionic component include, but are not limited to, tetrakis(pentafluorophenyl)borate group, tris(pentafluoroethyl)trifluorophosphate salts, and hexafluorophosphate salts. Accordingly, the component (C) preferably includes a cationic component containing three or more aromatic rings, and an anionic component containing a central element selected from boron and phosphorus.

The component (C) contained in the curable composition according to the present invention is preferably, but not limitatively, selected from cationic photoinitiators and thermal cationic polymerization initiators. The component (C) in the curable composition according to the present invention may include each of different curing catalysts alone or in combination.

Photo-Cationic Polymerization Initiator

The cationic photoinitiators are cationic photoinitiators which generate a cationic species upon light irradiation and initiates curing reactions of cationically curable compounds. The cationic photoinitiators each include a cationic moiety and an anionic moiety. The cationic moiety absorbs light. The anionic moiety acts as an acid source. The component (C) may include each of different cationic photoinitiators alone or in combination.

Examples of the cationic photoinitiators for use in the present invention include, but are not limited to, diazonium salt compounds, iodonium salt compounds, sulfonium salt compounds, phosphonium salt compounds, selenium salt compounds, oxonium salt compounds, ammonium salt compounds, and bromine salt compounds.

Among them, sulfonium salt compounds are preferably used so as to form a cured product with excellent curability. Examples of the cationic moiety in the sulfonium salt compounds include, but are not limited to, arylsulfonium ions such as triphenylsulfonium ion, diphenyl[4-(phenylthio)phenyl]sulfonium ion, and tri-p-tolyl sulfonium ion, of which triarylsulfonium ions are typified.

Examples of the anionic moiety in the cationic photoinitiator include, but are not limited to, $BF_4^-$, $B(C_6F_5)_4^-$, $PF_6^-$, $[(Rf)_nPF_{6-n}]^-$ (where Rf represents an alkyl group except with 80% or more of hydrogen atoms being substituted with fluorine atoms; and n represents an integer of 1 to 5), $AsF_6^-$, $SbF_6^-$, and pentafluorohydroxyantimonate.

Examples of the cationic photoinitiators include, but are not limited to, diphenyl[4-(phenylthio)phenyl]sulfonium tetrakis(pentafluorophenyl)borate, diphenyl[4-(phenylthio)phenyl]sulfonium hexafluorophosphate, diphenyl[4-(phenylthio)phenyl]sulfonium tris(pentafluoroethyl)trifluorophosphate, and (1,1"-biphenyl)-4-yl[4-(1,1"-biphenyl)4-ylthiophenyl]phenyl tetrakis(pentafluorophenyl)borate. Examples of corresponding commercial products include, but are not limited to, products available under the trade names of: CYRACURE UVI-6970, CYRACURE UVI-6974, CYRACURE UVI-6990, and CYRACURE UVI-950 (each from Union Carbide Corporation, U.S.A.); IRGACURE 250, IRGACURE 261, and IRGACURE 264 (each from Ciba Specialty Chemicals Corporation); SP-150, SP-151, SP-170, and OPTOMER SP-171 (each from ADEKA CORPORATION); CG-24-61 (from Ciba Specialty Chemicals Corporation); DAICAT II (from Daicel Corporation); UVAC1590 and UVAC1591 (each from DAICEL-CYTEC Company, Ltd.); CI-2064, CI-2639, CI-2624, CI-2481, CI-2734, CI-2855, CI-2823, CI-2758, and CIT-1682 (each from Nippon Soda Co., Ltd.); PI-2074 (from Rhodia, pentafluorophenylborate tolylcumyliodonium salt); FFC509 (from Minnesota Mining & Manufacturing Co.); BBI-102, BBI-101, BBI-103, MPI-103, TPS-103, MDS-103, DTS-103, NAT-103, and NDS-103 (each from Midori Kagaku Co., Ltd.); CD-1010, CD-1011, and CD-1012 (from Sartomer Company, Inc., U.S.A.); and CPI-100P and CPI-101A (each from San-Apro Ltd.).

Thermal Cationic Polymerization Initiator

Examples of the thermal cationic polymerization initiators include, but are not limited to, diazonium salt compounds, iodonium salt compounds, sulfonium salt compounds, phosphonium salt compounds, selenium salt compounds, oxonium salt compounds, ammonium salt compounds, and bromine salt compounds. The component (C) may include each of different thermal cationic polymerization initiator alone or in combination.

Examples of the thermal cationic polymerization initiators further include, but are not limited to, compounds between a chelate compound and a silanol; and compounds between a chelate compound and a phenol. The chelate compound is one formed between a metal and one of acetoacetic acid and a diketone. The metal is exemplified by, but is not limited to, aluminum and titanium. The silanol is exemplified by, but is not limited to, triphenylsilanol. The phenol is exemplified by, but is not limited to, bisphenol-S. Examples of commercial products of the thermal cationic polymerization initiators include, but are not limited to, products available under the trade names of: San-Aid SI-45, San-Aid SI-47, San-Aid SI-60, San-Aid SI-60L, San-Aid SI-80, San-Aid SI-80L, San-Aid SI-100, San-Aid SI-100L, San-Aid SI-110L, and San-Aid SI-180L (each from SAN-SHIN CHEMICAL INDUSTRY CO., LTD.); CI-2921, CI-2920, CI-2946, CI-3128, CI-2624, CI-2639, and CI-2064 (each from Nippon Soda Co., Ltd.); PP-33, CP-66, and CP-77 (from ADEKA CORPORATION); and FC-509 and FC-520 (each from Minnesota Mining & Manufacturing Co.).

The component (C) may be contained in a proportion not critical, but preferably 0.01 to 8 parts by weight, more preferably 0.1 to 5 parts by weight, furthermore preferably 0.2 to 4 parts by weight, and particularly preferably 0.5 to 3 parts by weight, relative to 100 parts by weight of the total weight of the curable compounds for use in the present invention. The component (C), when contained in a proportion of equal to or more than 0.01 part by weight, may allow the curable composition to be cured at a higher curing rate, may eliminate or minimize curing failure, and may contribute typically to low permeability, high gas-barrier properties, and satisfactory heat resistance. The component (C), when contained in a proportion of equal to or less than 8 percent by weight, may offer advantages in cost and may contribute typically to restrainment of heterogeneous reactions and restrainment of outgassing.

In particular, the curable composition preferably contains the component (B) in a content of 30 to 95 percent by weight and the component (C) in a content of 0.01 to 8 percent by weight based on the total weight (100 percent by weight) of the curable composition and contains the component (C) in a content of 0.01 to 8 percent by weight based on the total weight (100 percent by weight) of the curable composition.

Assume that the component (C) is selected from the preferred ones and is used in a content within the preferred range. In particular, the component (C) in this case effectively allows the curable composition to be cured at a higher curing rate. However, the component (C) has the effect of promoting outgas evolution. In contrast, assume that the component (B) is selected from the preferred ones having molecular weights and other properties within the preferred ranges and is used in a content within the preferred range. The component (B) in this case may allow the curable composition to be cured at a higher curing rate while restraining outgassing typically by using the component (C) in a smaller content. This configuration may give an excellent cured product that has low moisture permeability, high gas-barrier properties, heat resistance, curability, cost, and outgassing restrainment all at satisfactory levels.

Curing Accelerator

The curable composition according to the present invention may include a curing accelerator which increases the curing rate. The curing accelerator may be selected from known or common curing accelerators. Examples of the curing accelerators include, but are not limited to, 1,8-diazabicyclo[5.4.0]undecene-7 (DBU) and salts thereof (e.g., phenol salt, octanoic acid salt, p-toluenesulfonic acid salt, and tetraphenylborate salt); 1,5-diazabicyclo[4.3.0]nonene-5 (DBN) and salts thereof (e.g., phosphonium salt, sulfonium salt, quaternary ammonium salt, and iodonium salt); tertiary amines such as benzyldimethylamine, 2,4,6-tris(dimethylaminomethyl)phenol, and N,N-dimethylcyclohexylamine; imidazoles such as 2-ethyl-4-methylimidazole and 1-cyanoethyl-2-ethyl-4-methylimidazole; phosphoric esters, triphenylphosphine and other phosphines; phosphonium compounds such as tetraphenylphosphonium tetra(p-tolyl)borate; organometallic salts such as tin octoate and zinc octoate; and metal chelates. The curable composition may include each of different curing accelerators alone or in combination.

The curing catalyst may also be selected from commercial products available typically as U-CAT SA 506, U-CAT SA 102, U-CAT 5003, and U-CAT 18X (each from San-Apro Ltd.); TPP-K and TPP-MK (each from Hokko Chemical Industry Co., Ltd.); and PX-4ET (from by Nippon Chemical Industrial Co., Ltd.).

The curing accelerator may be contained in a content of preferably 0.05 to 5 percent by weight, more preferably 0.1 to 3 percent by weight, furthermore preferably 0.2 to 3 percent by weight, and particularly preferably 0.25 to 2.5 percent by weight, based on the total weight (100 percent by weight) of the curable composition according to the present invention. This is preferred typically for effectively accelerating the curing of the curable composition and for eliminating or minimizing the coloring of the cured product.

Radical Photoinitiator

The curable composition according to the present invention may include a radical photoinitiator (photoradical polymerization initiator). Examples of the radical photoinitiator include, but are not limited to, benzophenone, acetophenone, benzil, dibenzylmethyl ketone, benzoin, benzoin methyl ether, benzoin ethyl ether, benzoin isopropyl ether, dimethoxyacetophenone, dimethoxyphenylacetophenone, diethoxyacetophenone, diphenyl disulfite, methyl o-benzoylbenzoate, 4-methyl dimethylaminobenzoate (e.g., trade name KAYACURE EPA supplied by Nippon Kayaku Co., Ltd.), 2,4-diethylthioxanthone (e.g., trade name KAYACURE DETX supplied by Nippon Kayaku Co., Ltd.), 2-methyl-1-[4-(methyl)phenyl]-2-morpholinopropanone-1 (e.g., trade name IRGACURE 907 supplied by Ciba Geigy Ltd.), 2-dimethylamino-2-(4-morpholino)benzoyl-1-phenylpropane and other 2-amino-2-benzoyl-1-phenylalkanone compounds, tetra(t-butylperoxycarbonyl)benzophenone, benzil, 2-hydroxy-2-methyl-1-phenyl-propan-1-one, 4,4-bisdiethylaminobenzophenone and other aminobenzene derivatives, 2,2'-bis(2-chlorophenyl)-4,5,4',5'-tetraphenyl-1,2'-biimidazole (e.g., trade name B-CIM supplied by Hodogaya Chemical Co., Ltd.) and other imidazole compounds, 2,6-bis(trichloromethyl)-4-(4-methoxynaphth-1-yl)-1,3,5-triazine and other halomethylated triazine compounds, and 2-trichloromethyl-5-(2-benzofuran-2-yl-ethyenyl)-1,3,4-oxadiazole and other halomethyloxadiazole compounds. The curable composition may include each of different radical photoinitiators alone or in combination. The curable composition may further include a photosensitizer as needed. Preferred examples of the radical photoinitiator include, but are not limited to, combinations of an imidazole compound and an aminobenzene derivative; 2-amino-2-benzoyl-1-phenylalkane compounds; halomethylated triazine compounds; and halomethyloxadiazole compounds. These are preferred from the viewpoints typically of sensitivity and chemical resistance.

Radical Thermal Initiator

The curable composition according to the present invention may include a radical thermal initiator (thermal radical polymerization initiator). Examples of the radical thermal initiator include, but are not limited to, organic peroxides. Examples of the organic peroxides include, but are not limited to, dialkyl peroxides, acyl peroxides, hydroperoxides, ketone peroxides, and peroxy esters. Specifically, examples of the organic peroxides include, but are not limited to, benzoyl peroxide, t-butyl peroxy-2-ethylhexanoate, 2,5-dimethyl-2,5-di(2-ethylhexanoyl)peroxyhexane, t-butyl peroxybenzoate, t-butyl peroxide, cumene hydroperoxide, dicumyl peroxide, di-t-butyl peroxide, 2,5-dimethyl-2,5-dibutylperoxyhexane, 2,4-dichlorobenzoyl peroxide, di-t-butyl peroxide di-isopropylbenzene, 1,1-bis(t-butylperoxy)-3,3,5-trimethylcyclohexane, methyl ethyl ketone peroxide, and 1,1,3,3-tetramethylbutylperoxy-2-ethylhexanoate. The curable composition may further include a metal salt in combination with the radical thermal initiator. Examples of the metal salt include, but are not limited to, naphthenic acid salts and octenoic acid salts of metals such as cobalt, manganese, lead, zinc, and vanadium and are exemplified by cobalt naphthenate, manganese naphthenate, zinc naphthenate, and cobalt octenoate. Likewise, the curable composition may include a tertiary amine such as dimethylaniline.

The curable composition according to the present invention may contain the radical photoinitiator and/or the radical thermal initiator in a content of preferably 0.1 to 5 percent by weight, and more preferably 0.5 to 4 percent by weight, based on the total weight (100 percent by weight) of the curable composition.

The curable composition according to the present invention may include each of different radical photoinitiators and/or each of different radical thermal initiators alone or in combination.

Retarder

Assume that the curable composition according to the present invention includes a cationic photoinitiator (photocationic polymerization initiator) as the polymerization initiator. In this case, the curable composition may further include a retarder (cure retarder). Examples of the retarder include, but are not limited to, azole compounds such as pyrrole, pyrazole, 3,5-dimethylpyrazole, imidazole, 1,2,3-triazole, and 1,2,4-triazole; and polyol compounds (in particular, aliphatic polyol compounds) such as ethylene glycol, propylene glycol, polyethylene glycol, polypropylene glycol, butylene glycol and other (poly)alkylene glycols, glycerol, polyglycerols, pentaerythritol, polycaprolactone polyols, and crown ethers. The curable composition may include each of different retarders alone or in combination. The presence of the retarder may control the working life (pot life) and curing start time of the curable composition according to the present invention after light irradiation. More specifically, the retarder functions as follows. The retarder traps a cation generated by the cationic photoinitiator upon UV irradiation. This restrains or retards the cationic polymerization of curable compounds. The retarder, upon heat treatment, releases the cation to allow the cationic polymerization of the curable compounds to proceed. Of the retarders, azole compounds do not cause outgassing and are preferred. One or more of the azole compounds, when added to the curable composition, may freely control the curable composition working life. Assume that the curable composition containing one or more azole compounds forms a coating, the coating is irradiated with ultraviolet rays, then applied to an organic electroluminescence element, and subjected to a heat treatment. This allows sealing of the organic electroluminescence element without directly exposing the organic electroluminescence element to the ultraviolet rays. Specifically, the organic electroluminescence element may be sealed with a cured product that less causes outgassing and has moisture barrier properties.

The retarder(s) may be used (blended) in an amount of typically about 5 to about 25 percent by weight and preferably 10 to 25 percent by weight, relative to the amount of the cationic photoinitiator. When the curable composition contains two or more different cationic photoinitiator, the "amount of the cationic photoinitiator" refers to the total amount of the two or more different cationic photoinitiators.

Component (D)

The component (D) for use in the present invention is conductive fiber-bearing particles (conductive fiber-supporting particles; conductive fiber-coated particles) each including a particulate substance and a fibrous conductive substance lying on or over the particulate substance. The fibrous conductive substance is also referred to as a "conductive fiber". In the conductive fiber-bearing particles for use in the present invention, the term "lie (lying) on or over" refers to that the conductive fiber lies on or over part or whole of the surface of the particulate substance. The conductive fiber has only to lie on or over at least part of the particulate substance surface in the conductive fiber-bearing particles for use in the present invention. In the conductive fiber-bearing particles, the area (total area) of portions on or over which the conductive fiber does not lie may be larger than the area (total area) of the other portions on or over which the conductive fiber lies. The particulate substance and the conductive fiber do not necessarily have to be in contact with each other in the conductive fiber-bearing particles for use in the present invention. Usually, however, part of the conductive fiber is in contact with the particulate substance surface.

FIG. 1 is an illustrative scanning electron photomicrograph of the conductive fiber-bearing particles for use in the present invention. As illustrated in FIG. 1, the conductive fiber-bearing particles for use in the present invention has a configuration in which a conductive fiber lies on or over at least of a particulate substance. The particular substance herein is the spherical substance in FIG. 1. The conductive fiber herein is the fibrous substance in FIG. 1.

Particulate Substance

The particulate substance constituting the conductive fiber-bearing particles for use in the present invention is a particulate structure.

Examples of the material (raw material) to constitute the particulate substance include, but are not limited to, known or common materials such as metals, plastics, rubbers, ceramics, glass, and silica. Among them, the material to constitute the particulate substance is preferably selected from transparent materials such as transparent plastics, glass, and silica, and is particularly preferably selected from transparent plastics. The transparent plastics are preferred for their flexibility.

Examples of the transparent plastics include, but are not limited to, thermosetting resins and thermoplastic resins. Examples of the thermosetting resins include, but are not limited to, poly(meth)acrylate resins; polystyrene resins; polycarbonate resins; polyesters; polyurethane resins; epoxy resins; polysulfone resins; amorphous polyolefin resins; network polymers obtained by polymerizing a multifunctional monomer alone or in combination with another monomer; phenol-formaldehyde resins, melamine-formaldehyde resins, benzoguanamine-formaldehyde resins, and urea-formaldehyde resins. Examples of the above multifunctional monomer include, but are not limited to, divinylbenzene, hexatriene, divinyl ether, divinyl sulfone, diallylcarbinols, alkylene diacrylates, oligo- or poly-alkylene glycol diacrylates, oligo- or poly-alkylene glycol dimethacrylates, alkylene triacrylates, alkylene tetraacrylates, alkylene trimethacrylates, alkylene tetramethacrylates, alkylenebisacrylamides, alkylenebismethacrylamides, and polybutadiene oligomers that are modified with acryl at both termini. Examples of the thermoplastic resins include, but are not limited to, ethylene/vinyl acetate copolymers, ethylene/vinyl acetate/unsaturated carboxylic acid copolymers, ethylene/ethyl acrylate copolymers, ethylene/methyl methacrylate copolymers, ethylene/acrylic acid copolymers, ethylene/methacrylic acid copolymers, ethylene/maleic anhydride copolymers, ethylene/aminoalkyl methacrylate copolymers, ethylene/vinylsilane copolymers, ethylene/glycidyl methacrylate copolymers, ethylene/hydroxyethyl methacrylate copolymers, methyl (meth)acrylate/styrene copolymers, and acrylonitrile/styrene copolymers.

Examples of the shape of the particulate substance include, but are not limited to, spheroidal shapes (e.g., spherical, approximately spherical, and ellipsoidal shapes), polyhedral shapes, rod-like shapes (e.g., cylindrical and prismatic shapes), planar shapes, scaly shapes, and amorphous shapes. Among them, the particulate substance preferably has a spheroidal or rod-like shape, more preferably has a spheroidal shape, and particular preferably has a spherical shape. The particulate substance, when having such a preferred shape, can contribute to production of the conductive fiber-bearing particles with high productivity. The resulting conductive fiber-bearing particles can be easily dispersed in the curable compounds and readily impart conductivity to the entire resin.

The particulate substance may have an average aspect ratio not critical, but preferably less than 20 (e.g., from 1 to less than 20), and particularly preferably 1 to 10. Assume that the particulate substance has an average aspect ratio of greater than the range. In this case, the conductive fiber-bearing particles, when blended in a small amount, may fail to impart excellent conductivity to the curable compounds. The average aspect ratio of the particulate substance may be measured typically in the following manner. Electron photomicrographs of a sufficient number of the particulate substance are taken using an electron microscope (SEM or TEM). Based on the electron photomicrographs, aspect ratios of the particulate substance (particles) are measured and arithmetically averaged to give the average aspect ratio. The sufficient number is typically equal to or more than 100, preferably equal to or more than 300; and in particular 100 or 300.

The particulate substance may have any configuration not limited and may have a single-layer configuration, or a multilayer configuration including two or more layers. The particulate substance may be selected from solid particles, hollow particles, porous particles, and any other particles.

The particulate substance may have an average particle diameter not critical, but preferably 0.1 to 100 μm, more preferably 1 to 50 μm, and furthermore preferably 5 to 30 μm. Assume that the particulate substance has an average particle diameter less than the range. In this case, the conductive fiber-bearing particles, when blended in a small amount, may fail to impart excellent conductivity to the cured product. In contrast, assume that the particulate substance has an average particle diameter greater than the range. In this case, the average particle diameter of the particulate substance may be greater than the thickness of a layer in which the organic electroluminescence element is sealed. This may often impede the formation of a coating having a uniform thickness. Assume that the particulate substance has an anisotropic shape. In this case, the average particle diameter in the major axis (longest dimension) direction is preferably controlled within the range. The average particle diameter of the particulate substance herein refers to a median diameter (d50) determined by a laser diffraction scattering technique.

The particulate substance is preferably transparent. Specifically, the particulate substance may have a total luminous transmittance in the visible wavelength region of not critical, but preferably equal to or more than 70%, and particularly preferably equal to or more than 75%. Assume that the particulate substance has a total luminous transmittance less than the range. In this case, the cured product (including the conductive fiber-bearing particles) may have lower transparency. The total luminous transmittance of the particulate substance in the visible wavelength region may be determined in the following manner. A material monomer(s) to constitute the particulate substance is placed between a pair of glass and is polymerized at a temperature in the range of from 80° C. to 150° C. to give a flat plate having a thickness of 1 mm. The total luminous transmittance of the flat plate in the visible wavelength region is measured in conformity to JIS K7361-1, and this is defined as the total luminous transmittance of the particulate substance in the visible wavelength region.

Assume that there are a first conductive substrate and a second conductive substrate, where the first conductive substrate has asperities in at least one surface; and that the curable composition is used for the bonding between the surface having asperities of the first conductive substrate and one surface of the second conductive substrate. In this case, the particulate substance preferably has flexibility. Specifically, the particulate substance may have a 10% compressive strength of typically equal to or less than 10 kgf/mm$^2$, preferably equal to or less than 5 kgf/mm$^2$, and particularly preferably equal to or less than 3 kgf/mm$^2$. The conductive fiber-bearing particles, when including a particulate substance having a 10% compressive strength within the range, can deform and conform to the fine asperity structure upon compression. Assume that the curable composition containing these conductive fiber-bearing particles is cured to a shape having a fine asperity structure. In this case, the particulate substance can extend even into the asperities. This can eliminate or minimize the formation of portions with poor conductivity.

The particulate substance may have a refractive index not critical, but preferably 1.4 to 2.7, and particularly preferably 1.5 to 1.8. When the particulate substance is a plastic particle, the refractive index of the particulate substance may be measured in the following manner. The material to constitute the particulate substance is polymerized at 80° C. to 150° C. to give a test specimen 20 mm long by 6 mm wide. The refractive index of the test specimen is measured at the sodium D line at 20° C. using a multi-wavelength Abbe refractometer (trade name DR-M2, supplied by ATAGO Co., Ltd.). The measurement is performed with the prism and the test specimen being in intimate contact with each other using monobromonaphthalene as a contact liquid.

The particulate substance preferably has a small different in refractive index from a cured product of the curable compounds for use in the present invention, where examples of the cured compounds include the component (A) and the component (B). Specifically, the absolute value of the difference in refractive index between the particulate substance constituting the conductive fiber-bearing particles (component (D)) and the cured product of the curable compounds for use in the present invention is preferably equal to or less than 0.1, more preferably equal to or less than 0.5, and particularly preferably equal to or less than 0.02. The refractive index herein is measured at 25° C. and at a wavelength of 589.3 nm. Specifically, the conductive fiber-bearing particles and the curable compounds contained in the curable composition according to the present invention preferably meet a condition specified by an expression as follows:

|(Refractive index (25° C., at a wavelength of 589.3 nm) of the particulate substance constituting the conductive fiber-bearing particles)−(Refractive index (25° C., at a wavelength of 589.3 nm) of the cured product of the curable compounds)|≤0.1

In addition, the particulate substance preferably has a sharp particle size distribution, namely, preferably has a small variation in particle size. The particulate substance, when having such a sharp particle size distribution, can contribute to excellent conductivity even when used in a smaller amount. Specifically, the particulate substance preferably has a coefficient of variation (CV) in particle size distribution of equal to or less than 40, and particularly preferably has a CV of equal to or less than 30.

The coefficient of variation in volume-basis particle size distribution of the particulate substance may be calculated according to an equation below. The particle size distribution may also be measured using an apparatus such as Particle Counting and Characterization System (trade name Coulter Multisizer, supplied by Beckman Coulter, Inc.). The equation is expressed as follows:

Coefficient of variation (CV) (%)=(S2/Dn)×100 where S2 represents a standard deviation in the volume-basis particle size distribution; and Dn represents a volume-basis median diameter (D50).

The particulate substance may be prepared by any of known or common techniques without limitation. For example, assume that the particulate substance is selected from metal particles. In this case, examples of techniques to prepare the particulate substance include, but are not limited to, gas phase techniques such as CVD technique and spray pyrolysis technique; and wet techniques by chemical reduction reactions. Assume that the particulate substance is selected from plastic particles. In this case, examples of techniques to prepare the particulate substance include, but are not limited to, a technique in which a monomer to constitute the above-exemplified resin (polymer) is polymerized by any of known polymerization techniques such as suspension polymerization technique, emulsion polymerization technique, seed polymerization technique, and dispersion polymerization technique.

The particulate substance for use in the present invention may also be selected from commercial products. Examples of thermoplastic resin particulate substances include, but are not limited to, products available under the trade names of: TECHPOLYMER MBX Series, TECHPOLYMER BMX Series, TECHPOLYMER ABX Series, TECHPOLYMER ARX Series, and TECHPOLYMER AFX Series (each from Sekisui Plastics Co., Ltd.); and Micropearl SP and Micropearl SI (each from Sekisui Chemical Co., Ltd.). Examples of thermoplastic resin particulate substances include, but are not limited to, products available under the trade name of FLO-BEADS SE (SOFT BEADS) (from Sumitomo Seika Chemicals Co., Ltd.); and under the product name of DUO-MASTER (from Sekisui Plastics Co., Ltd.).

Fibrous Conductive Substance (Conductive Fiber)

The conductive fiber constituting the conductive fiber-bearing particles for use in the present invention is a fibrous structure (linear structure) having conductivity (electroconductivity). The shape of the conductive fiber is not limited, as long as being fibrous (in the form of fiber). However, the conductive fiber (electroconductive fiber) has an average aspect ratio of preferably equal to or more than (e.g., 20 to 5000), more preferably 50 to 3000, and furthermore preferably 100 to 1000. Assume that the conductive fiber has an average aspect ratio less than the range. In this case, the conductive fiber-bearing particles, when blended in a small amount, may fail to allow the cured product to develop excellent conductivity. The average aspect ratio of the conductive fiber may be measured by a procedure similar to the measurement of the average aspect ratio of the particulate substance. As used herein the term or concept "fibrous" in the conductive fiber also means and includes "wire-like", "rod-like", and any other linear structures. In the present description, the "fiber having an average thickness of equal to or less than 1000 nm" is also referred to as a "nanowire".

The conductive fiber may have an average thickness (average diameter) not critical, but preferably 1 to 400 nm, more preferably 10 to 200 nm, and furthermore preferably 50 to 150 nm. Assume that the conductive fibers have an average thickness less than the range. In this case, the conductive fibers may readily aggregate with each other. This may impede the preparation of the conductive fiber-bearing particles. In contrast, assume that the conductive fiber has an average thickness greater than the range. This may impede coating of the particulate substance with the conductive fiber and may impede efficient preparation of the conductive fiber-bearing particles. The average thickness of the conductive fiber may be measured in the following manner. Electron photomicrographs of a sufficient number of conductive fibers are taken using an electron microscope (SEM or TEM). Based on the electron photomicrographs, the thicknesses (diameters) of the conductive fibers are measured and arithmetically averaged to give the average thickness. The sufficient number is typically equal to or more than 100, preferably equal to or more than 300; and in particular 100 or 300.

The conductive fiber may have an average length not critical, but preferably 1 to 100 μm, more preferably 5 to 80 μm, and furthermore preferably 10 to 50 μm. Assume that the conductive fiber has an average length less than the range. This may impede coating of the particulate substance with the conductive fiber and may impede efficient preparation of the conductive fiber-bearing particles. In contrast, assume that the conductive fiber has an average length greater than the range. In this case, the conductive fiber (one conductive fiber) may be attached to or adsorbed by two or more particles. This may cause the conductive fiber-bearing particles to aggregate (to have inferior dispersibility). The average length of the conductive fiber may be measured in the following manner. Electron photomicrographs of a sufficient number of conductive fibers are taken using an electron microscope (SEM or TEM). Based on the electron photomicrographs, the lengths of the conductive fibers are measured and arithmetically averaged to give the average length. The sufficient number is typically equal to or more than 100, preferably equal to or more than 300; and in particular 100 or 300. The lengths of the conductive fibers should be measured while straightening the conductive fibers. In fact, however, many conductive fibers are curved or bent. Under these circumstances, the lengths herein are determined by calculating projected diameters and projected areas of the conductive fibers based on the electron photomicrographs using an image analyzer, and calculating the lengths from the projected areas and the projected diameters according to an equation on the assumption that each conductive fiber is a solid cylinder. The equation is expressed as follows:

Length=(Projected area)/(Projected diameter)

The material (raw material) to constitute the conductive fiber is not limited, as long as being a conductive raw material, and is exemplified by, but are not limited to, metals, semiconductors, carbon materials, and conductive polymers.

Examples of the metals include, but are not limited to, known or common metals such as gold, silver, copper, iron, nickel, cobalt, and tin, and alloys of these metals. Among them, silver has excellent conductivity and is preferred in the present invention.

Examples of the semiconductors include, but are not limited to, known or common semiconductors such as cadmium sulfide and cadmium selenide.

Examples of the carbon materials include, but are not limited to, known or common carbon materials such as carbon fibers and carbon nanotubes.

Examples of the conductive polymers include, but are not limited to, polyacetylenes, polyacenes, poly-p-phenylenes, poly-(p-phenylenevinylene)s, polypyrroles, polyanilines, polythiophenes, and derivatives of these polymers. Examples of the derivatives include, but are not limited to, polymers corresponding to the above-mentioned polymers, except with one or more substituents on the corresponding polymer skeleton. Examples of the substituents include alkyl groups, hydroxy group, carboxy group, and ethylenedioxy group. Specifically, non-limiting examples of the derivatives are polyethylenedioxythiophenes. Among them, preferred in the present invention are polyacetylenes, polyaniline and derivatives thereof, polypyrroles and derivatives thereof, and polythiophenes and derivatives thereof. The conductive polymers may each be doped with a known or common dopant. Examples of the dopant include, but are not limited to, acceptors such as halogens, halides, and Lewis acids; and donors such as alkali metals and alkaline earth metals.

The conductive fiber for use in the present invention preferably includes at least one conductive nanowire and particularly preferably includes at least one conductive nanowire selected from the group consisting of metal nanowires, semiconductor nanowires, carbon fibers, carbon nanotubes, and conductive polymer nanowires. Among these nanowires, silver nanowires have excellent conductivity and are most preferred.

The conductive fiber may be prepared by a known or common preparation method. For example, the metal nanowires may be prepared by a liquid phase method or a gas phase method. More specifically, the silver nanowires may be prepared typically by the methods described in Mater. Chem. Phys. 2009, 114, 333-338; Adv. Mater. 2002, 14, pp. 833-837; Chem. Mater. 2002, 14, pp. 4736-4745; and Japanese Unexamined Patent Application Publication (Translation of PCT Application) (JP-A) No. 2009-505358. Gold nanowires may be prepared typically by the method described in JP-A No. 2006-233252. Copper nanowires may be prepared typically by the method described in JP-A No. 2002-266007. Cobalt nanowires may be prepared by the method described in JP-A No. 2004-149871. The semiconductor nanowires may be prepared typically by the method described in JP-A No. 2010-208925. The carbon fibers may be prepared typically by the method described in JP-A No. H06-081223. The carbon nanotubes may be prepared typically by the method described in JP-A No. H06-157016. The conductive polymer nanowires may be prepared typically by the methods described in JP-A No. 2006-241334 and JP-A No. 2010-76044. The conductive fiber may also be selected from commercial products.

The conductive fiber-bearing particles for use in the present invention may be prepared typically by mixing the particulate substance with the conductive fiber in a medium. Specifically, examples of methods for preparing the conductive fiber-bearing particles for use in the present invention include, but are not limited to, methods (1) to (4) as follows.

In the method (1), the particulate substance is dispersed in a medium to give a dispersion as a particle dispersion. Independently, the conductive fiber is dispersed in the medium to give a dispersion as a fiber dispersion. The particle dispersion is mixed with the fiber dispersion to give a mixture, from which the medium is removed as needed. This procedure yields conductive fiber-bearing particles for use in the present invention (or a dispersion of the conductive fiber-bearing particles).

In the method (2), the particle dispersion is combined with and mixed with the conductive fiber to give a mixture, from which the medium is removed as needed. This procedure yields conductive fiber-bearing particles for use in the present invention (or a dispersion of the conductive fiber-bearing particles).

In the method (3), the fiber dispersion is combined with and mixed with the particulate substance to give a mixture, from which the medium is removed as needed. This procedure yields conductive fiber-bearing particles for use in the present invention (or a dispersion of the conductive fiber-bearing particles).

In the method (4), the medium is combined with and mixed with the particulate substance and the conductive fiber to give a mixture, from which the medium is removed as needed. This procedure yields conductive fiber-bearing particles for use in the present invention (or a dispersion of the conductive fiber-bearing particles).

Among them, the method (1) is preferred in the present invention so as to give homogeneous conductive fiber-bearing particles.

Examples of the medium for use in the preparation of the conductive fiber-bearing particles for use in the present invention include, but are not limited to, water; alcohols such as methanol, ethanol, propanol, isopropyl alcohol, and butanol; ketones such as acetone, methyl ethyl ketone (MEK), and methyl isobutyl ketone (MIBK); aromatic hydrocarbons such as benzene, toluene, xylenes, and ethylbenzene; ethers such as diethyl ether, dimethoxyethane, tetrahydrofuran, and dioxane; esters such as methyl acetate, ethyl acetate, isopropyl acetate, and butyl acetate; amides such as N,N-dimethylformamide and N,N-dimethylacetamide; and nitriles such as acetonitrile, propionitrile, and benzonitrile. Each of them may be used alone, or in combination as a medium mixture. Among them, alcohols and ketones are preferred in the present invention.

Assume that one or more of the curable compounds for use in the present invention (e.g., epoxy compounds) are liquid. In this case, such liquid curable compounds can be used as the medium. The use of the liquid curable compounds as the medium can give a curable composition including the curable compounds and the conductive fiber-bearing particles for use in the present invention without the step of removing the medium.

The medium may have a viscosity not critical, but has a viscosity at 25° C. of preferably equal to or less than 10 cP (e.g., 0.1 to 10 cP), and particularly preferably 0.5 to 5 cP. This is preferred from the viewpoint of efficient production of the conductive fiber-bearing particles. The viscosity of the medium at 25° C. may be measured typically using an E-type viscometer (trade name VISCONIC, supplied by Tokimec, Inc.) with a rotor 1° 34'×R24 at a number of revolutions of 0.5 rpm and a measurement temperature of 25° C.

The medium may have a boiling point of preferably equal to or lower than 200° C., more preferably equal to or lower than 150° C., and furthermore preferably equal to or lower than 120° C. at one atmospheric pressure. This is preferred for efficient preparation of the conductive fiber-bearing particles.

Upon mixing of the particulate substance with the conductive fiber in the medium, the particulate substance may be present in a proportion of typically about 0.1 to about 50 parts by weight, and preferably 1 to 30 parts by weight, per 100 parts by weight of the medium. Control of the particulate substance proportion within the range may allow more efficient preparation of the conductive fiber-bearing particles.

Upon mixing of the particulate substance with the conductive fiber in the medium, the conductive fiber may be present in a proportion of typically about 0.1 to about 50 parts by weight and preferably 1 to 30 parts by weight per 100 parts by weight of the medium. Control of the conductive fiber proportion within the range may allow more efficient preparation of the conductive fiber-bearing particles.

Upon mixing of the particulate substance with the conductive fiber in the medium, the particulate substance and the conductive fiber may be present in such proportions that the ratio of the surface area of the particulate substance to the projected area of the conductive fiber is typically from about 100:100 to about 100:1, and preferably from 100:50 to 100:10. Control of the ratio within the range may allow more efficient preparation of the conductive fiber-bearing particles. The surface area of the particulate substance may be measured by multiplying the specific surface area by the mass (used amount) of the particulate substance, where the specific surface area is determined by the BET method (in conformity with JIS Z8830). The projected area of the conductive fiber may be measured typically in the following manner. Electron photomicrographs of a sufficient number of conductive fibers are taken using an electron microscope (SEM or TEM) as mentioned above. Based on the electron photomicrographs, the projected areas of these conductive fibers are calculated using an image analyzer and are arithmetically averaged to give the projected area of the conductive fiber. The sufficient number is typically equal to or more than 100, preferably equal to or more than 300; and in particular 100 or 300.

Removal of the medium after mixing the particulate substance with the conductive fiber gives conductive fiber-bearing particles as solids. Examples of techniques for the medium removal include, but are not limited to, known or common techniques such as heating and distilling off under reduced pressure. The medium does not necessarily have to be removed. The mixture after mixing may also be used typically as a dispersion of the conductive fiber-bearing particles for use in the present invention.

The conductive fiber-bearing particles for use in the present invention can be prepared by mixing the materials (the particulate substance and the conductive fiber) in a medium as described above, without requiring a complicated step. The conductive fiber-bearing particles are thereby advantageous in production cost.

Assume that the particulate substance has an average particle diameter of A [μm]. In this case, in particular, the conductive fiber to be used in combination with the particulate substance may have an average length of typically equal to or more than A [μm], preferably equal to or more than 0.5 A [μm], more preferably equal to or more than 1.0 A [μm], and furthermore preferably equal to or more than 1.5 A [μm]. The combination use of the particulate substance and the conductive fiber having an average length as above may allow more efficient preparation of the conductive fiber-bearing particles for use in the present invention. In particular, assume that the particulate substance is spherical or approximately spherical; and that the particulate substance has an average circumference of B [μm]. In this case, the conductive fiber to be used in combination with the particulate substance preferably has an average length of equal to or more than one-sixth B (B×⅙) [μm], and more preferably equal to or more than B [μm]. The average circumference of the particulate substance may be determined in the following manner. Electron photomicrographs of a sufficient number of particulate substances are taken using an electron microscope (SEM or TEM). Based on the electron photomicrographs, the circumferences of the particulate substances are measured and are arithmetically averaged to give the average circumference. The sufficient number is typically equal to or more than 100, preferably equal to or more than 300; and in particular 100 or 300.

The proportions of the particulate substance and the conductive fiber both constituting the conductive fiber-bearing particles for use in the present invention are preferably such that the ratio of the particulate substance surface area to the conductive fiber projected area is typically from about 100:100 to about 100:1, and in particular from 100:50 to 100:10. Control of the ratio within the range may impart conductivity to the cured product more efficiently while ensuring transparency of the cured product. The particulate substance surface area and the conductive fiber projected area may be measured by the methods described above.

The conductive fiber-bearing particles for use in the present invention has the configuration. The configuration may allow the conductive fiber-bearing particles, even when blended in a small amount, to impart excellent conductivity (in particular, conductivity in the thickness direction) to the cured product and may allow the cured product to have transparency and conductivity both at excellent levels.

In an embodiment, the conductive fiber-bearing particles for use in the present invention has flexibility (e.g., has a 10% compressive strength of equal to or less than 10 kgf/mm$^2$). Assume that the curable composition containing the flexible conductive fiber-bearing particles is shaped into a shape having fine asperities. In this case, the conductive fiber-bearing particles deform so as to conform to the asperity structure and extend even into the fine asperities. This eliminates or minimizes the formation of portions with poor conductivity and can give an organic electroluminescence device that has excellent conducting performance.

The curable composition may include each of different types of conductive fiber-bearing particles alone or in combination. The curable composition may contain the conductive fiber-bearing particles (component (D)) in a proportion (blending amount) of typically about 0.01 to about 30 parts by weight, preferably 0.1 to 20 parts by weight, more preferably 0.3 to 15 parts by weight, and particularly preferably 0.5 to 5 parts by weight, per 100 parts by weight of the curable compounds for use in the present invention. Assume that the conductive fiber-bearing particles are contained in a proportion of less than 0.01 part by weight. In this case, the resulting cured product may be insufficient in conductivity in some uses. In contrast, assume that the conductive fiber-bearing particles are contained in a proportion of more than 30 parts by weight. In this case, the resulting cured product may be insufficient in transparency in some uses.

The curable composition according to the present invention may contain the conductive fiber-bearing particles (component (D)) in a content of preferably 0.1 to 60 percent by volume, more preferably 0.2 to 60 percent by volume, furthermore preferably 0.3 to 50 percent by volume, and particularly preferably 0.3 to 40 percent by volume, based on the total volume (100 percent by volume) of the curable composition.

Assume that the cured product is designed to develop anisotropic conductivity, where anisotropic conductivity refers to such an electric anisotropy as to be conductive in a specific direction, but to be non-conductive in the other directions. Particularly in this case, the curable composition according to the present invention may contain the conductive fiber-bearing particles (component (D)) in a content of preferably equal to or less than 30 percent by volume (e.g., 0.1 to 10 percent by volume), and particularly preferably 0.3 to 5 percent by volume, based on the total volume (100 percent by volume) of the curable composition. Control of the conductive fiber-bearing particles content within the range may allow the cured product to develop excellent conductivity in the specific direction. The content of the conductive fiber-bearing particles (component (D)) may be approximately calculated typically by dividing the total weight of the conductive fiber-bearing particles by the density of the particles (conductive fiber-bearing particles).

The curable composition according to the present invention may contain the particulate substance (particulate substance contained in the conductive fiber-bearing particles) in a proportion (blending amount) of typically about 0.09 to about 6.0 parts by weight, preferably 0.1 to 4.0 parts by weight, more preferably 0.3 to 3.5 parts by weight, furthermore preferably 0.3 to 3.0 parts by weight, particularly preferably 0.3 to 2.5 parts by weight, and most preferably 0.5 to 2.0 parts by weight, per 100 parts by weight of the curable compounds. The curable composition may contain the particulate substance in a content of typically 0.02 to about 7 percent by volume, preferably 0.1 to 5 percent by volume, particularly preferably 0.3 to 3 percent by volume, and most preferably 0.4 to 2 percent by volume, based on the total volume (100 percent by volume) of the curable composition. Assume that the curable composition contains the conductive fiber-bearing particles in a content of less than 0.02 percent by volume. In this case, the resulting cured product may be insufficient in conductivity in some uses. In contrast, assume that the curable composition contains the conductive fiber-bearing particles in a content of more than 7 percent by volume. In this case, the resulting cured product may be insufficient in transparency in some uses.

The curable composition according to the present invention may contain the conductive fiber in a proportion (blending amount) of typically about 0.01 to about 1.0 part by weight, preferably 0.02 to 0.8 part by weight, more preferably 0.03 to 0.6 part by weight, furthermore preferably 0.03 to 0.4 part by weight, and particularly preferably 0.03 to 0.2 part by weight, per 100 parts by weight of the curable compounds. The curable composition may contain the conductive fiber in a content of typically about 0.01 to about 1.1 percent by volume, preferably 0.02 to 0.9 percent by volume, more preferably 0.03 to 0.7 percent by volume, and furthermore preferably 0.03 to 0.4 percent by volume, based on the total volume (100 percent by volume) of the curable composition.

The curable composition according to the present invention contains the conductive fiber lying on or over the particulate substance. This configuration allows the curable composition to form a cured product having sufficient conductivity even when the raw material having conductivity is used in an amount reduced to the range. The use of such a small amount of the conductive raw material may significantly reduce the deterioration in transparency of the cured product. The deterioration in transparency may be caused by the presence of the conductive raw material. In addition, the use may also significantly reduce the cost that has been largely occupied by the conductive raw material.

The curable composition according to the present invention may further include one or more other conductive substances. The "other conductive substances" refer to conductive substances other than the conductive fiber-bearing particles for use in the present invention. The other conductive substances may be selected typically, but not limitatively, from known or common conductive substances. For example, the conductive fiber may be used as the other substance.

The curable composition according to the present invention may contain the other conductive substance(s) (e.g., the conductive fiber) in a proportion (blending amount) of typically about 0 to about 10 parts by weight, preferably 0 to 5 parts by weight, and more preferably 0 to 1 part by weight, per 100 parts by weight of the conductive fiber-bearing particles.

Others

In addition to the components, the curable composition according to the present invention may further include one or more additives within ranges not adversely affecting the advantageous effects of the present invention. Examples of the additives include, but are not limited to, hydroxy-containing compounds such as ethylene glycol, diethylene glycol, propylene glycol, and glycerol; silicone-containing or fluorine-containing antifoaming agents; leveling agents; silane coupling agents such as γ-glycidoxypropyltrimethoxysilane and 3-mercaptopropyltrimethoxysilane; surfactants; inorganic fillers such as silica and alumina; flame retardants; colorants; antioxidants; ultraviolet absorbers; ion adsorbents; pigments; phosphors; mold release agents; and other common additives.

Curable Composition

The curable composition according to the present invention may be obtained by uniformly mixing the individual components. To form the curable composition according to the present invention, it is desirable that the components are subjected to stirring, dissolution, mixing, dispersion, and/or any other procedure using a generally known mixing device so as to give a composition that is uniform as much as possible. Examples of the mixing device include, but are not limited to, planetary (rotation-revolution) mixing and deaeration apparatuses, homogenizers, planetary, triple roll mills, bead mills, and ultrasound.

The curable composition according to the embodiment of the present invention may be produced by uniformly mixing the conductive fiber-bearing particles (component (D) (or dispersion of the conductive fiber-bearing particles), the curable compounds, and, as needed, other optional components with each other using the generally known mixing device. Examples of the production method include, but are not limited to, methods (1) an (2) as follows.

In the method (1), the particulate substance and the fibrous conductive substance are mixed with each other in a medium to give a dispersion of conductive fiber-bearing particles. The dispersion is stirred with and mixed with the curable compounds and, as needed, optional additives in predetermined proportions, followed by distilling off the medium, to give the curable composition.

In the method (2), conductive fiber-bearing particles are prepared via a step A and a step B mentioned below. The conductive fiber-bearing particles are stirred with and mixed with the curable compounds and, as needed, optional additives in predetermined proportions to give the curable composition.

In the step A, the particulate substance and the fibrous conductive substance are mixed with each other in a medium to give a dispersion of conductive fiber-bearing particles.

In the step B, the medium is removed from the dispersion of conductive fiber-bearing particles to give conductive fiber-bearing particles as solids, where the dispersion has been prepared via the step A. The removal of the medium may be performed typically by heating to distill off the medium and/or by filtration under reduced pressure.

The curable composition according to the embodiment of the present invention may be a one-component composition or a multi-component (e.g., two-component composition). In the one-component composition, all the components including the conductive fiber-bearing particles (component (D) (or dispersion of the conductive fiber-bearing particles), the curable compounds, and, as needed, optional other components have been mixed in advance. In the multi-component composition, the components including the conductive fiber-bearing particles (the component (D) (or dispersion of the conductive fiber-bearing particles), the curable compounds, and, as needed, optional other components are divided into two or more portions. The divided portions are stored separately and are mixed in predetermined proportions immediately before use.

Assume that the curable composition according to the present invention for sealing optical semiconductor is discharged using a discharger such as a dispenser. Upon the discharging of the curable composition, the conductive fiber-bearing particles (component (D)) are preferably highly dispersed in the curable composition. More preferably, the curable composition is discharged with stirring typically by a screw discharging method. The screw discharging method uses a discharger having a rotary driving mechanism such as a screw and discharges the curable composition by the rotation of the screw. Screw rotation speed, screw blade size, and other conditions are preferably adjusted as appropriate according typically to the viscosity of the curable composition and size of the conductive fiber-bearing particles (component (D)) contained in the curable composition.

The curable composition according to the present invention preferably has fluidity (flowability) at room temperature (25° C.). This is preferred from the viewpoint of dispensability of the curable composition in the step of sealing an optical semiconductor element. The curable composition according to the present invention may have a viscosity at room temperature (25° C.) of preferably 10 to 5000 mPa·s, more preferably 50 to 3000 mPa·s, and furthermore preferably 100 to 2000 mPa·s.

Cured Product

A cured product according to an embodiment of the present invention is obtained by curing the curable composition for sealing optical semiconductor. Assume that the curable composition includes a curable compound selected from compounds that act as materials for curable resins. In this case, the cured product may be obtained by applying at least one of heat and an active energy ray to the curable composition.

When the curable composition is cured by heating (heat application), the heating may be performed at a temperature (curing temperature) of typically about 45° C. to about 200° C., preferably 70° C. to 190° C., and particularly preferably 90° C. to 180° C. The heating may be performed for a heating time (curing time) of typically about 10 to about 600 minutes, preferably 30 to 540 minutes, and particularly preferably 60 to 480 minutes. The heating, if performed at a curing temperature and/or for a curing time lower than and/or shorter than the range, may lead to insufficient curing. In contrast, the heating, if performed at a curing temperature and/or for a curing time higher than and/or longer than the range, may lead to decomposition of the cured product. Although depending on various conditions and circumstances, the curing conditions may be adjusted as appropriate. For example, the curing time may be set shorter when the curing temperature is set higher. In contrast, the curing time may be set longer when the curing temperature is set lower.

Assume that the curable composition is cured by the application of an active energy ray. For example, when the curable composition is cured by the application of an ultraviolet ray, application conditions may be employed so that the integrated light quantity is typically preferably about 500 to about 5000 mJ/cm$^2$, and particularly preferably 1000 to 3000 mJ/cm$^2$.

The cured product according to the present invention may have a water vapor permeability not critical, but preferably equal to or less than 40 g/m$^2$·day, more preferably equal to or less than 30 g/m$^2$·day, and furthermore preferably equal to or less than 25 g/m$^2$·day. The water vapor permeability may be measured in conformity to JIS L1099 at a temperature of 60° C. and relative humidity of 90% after mounting the cured product to a permeability cup.

The cured product according to the present invention may have an outgassing amount not critical, but preferably equal to or less than 20 ppm, more preferably equal to or less than 15 ppm, and furthermore preferably equal to or less than 10 ppm. The cured product may have an acrolein amount of equal to or less than 3 ppm, more preferably equal to or less than 2 ppm, and furthermore preferably equal to or less than 1 ppm. The outgassing amount and the acrolein amount may be measured by heating the sample cured product in an oven at 80° C. for 60 minutes and measuring the amounts of outgases evolved upon the heating using a gas chromatography-mass spectrometry (GC/MS) system and using toluene as a reference material.

The cured product according to the present invention is preferably transparent. Specifically, the cured product has a total luminous transmittance (for a thickness of the cured product of 10 μm) of typically equal to or more than 80%, preferably equal to or more than 85%, and more preferably equal to or more than 90% in the visible wavelength region, where the cured product herein is adjusted to have a thickness of 10 μm. The total luminous transmittance of the cured product according to the present invention in the visible wavelength region may be measured in conformity to JIS K7361-1.

The cured product according to the embodiment of the present invention has excellent conductivity. The cured product has a volume resistivity of typically about 0.1 Ω·cm to about 10 MΩ·cm, and preferably 0.1 Ω·cm to 1 MΩ·cm. The volume resistivity of the cured product according to the embodiment of the present invention may be measured in conformity to JIS K6911.

Optical Semiconductor Device

The curable composition according to the present invention may be used to encapsulate an optical semiconductor element. This gives an optical semiconductor device that offers performance highly stably and has a long lifetime. Examples of the optical semiconductor device include, but are not limited to, light-emitting diodes, organic electroluminescences (organic ELs), electronic papers, and solar cells. Among them, organic electroluminescences (organic ELs) are preferred, of which top-emission organic electroluminescence (organic EL) is more preferred.

Curable Composition Including Component (D) for Sealing Optical Semiconductor, and Cured Product of Curable Composition The curable composition according to the present invention for sealing optical semiconductor preferably has a configuration as follows. The component (A) is a compounds that contains at least one functional group selected from the group consisting of epoxy groups, oxetanyl groups, vinyl ether groups, and (meth)acryloyl groups and contains at least one aromatic ring. The component (B) is selected from cycloaliphatic epoxy compounds excluding aromatic-ring-containing compounds. The component (C) is a curing catalyst that includes a cationic component and an anionic component and generates an acid upon application of light or heat, where the cationic component contains at least one aromatic ring, and the anionic component contains a central element selected from boron and phosphorus. This curable composition further includes, as the component (D), conductive fiber-bearing particles each including a particulate substance, and a fibrous conductive substance lying on or over the particulate substance. The presence of the component (D) allows the curable composition for sealing optical semiconductor element and the cured product of the curable composition to have excellent conductivity (in particular, excellent conductivity in the thickness direction).

The component (A) in the curable composition for sealing optical semiconductor preferably includes at least one of a compound (A1") and a compound (A2") as follows.

The compound (A1") is a compound that contains two or more functional groups selected from the group consisting of epoxy groups, oxetanyl groups, vinyl ether groups, and (meth)acryloyl groups per molecule and has a molecular weight of 100 to 10000.

The compound (A2") is a compound that has a molecular weight of 100 to 1000.

The component (B) in the curable composition for sealing optical semiconductor is preferably a compound that contains two or more cycloaliphatic epoxy groups, and the component (B) preferably has a molecular weight of 100 to 500. The component (B) is preferably the compound represented by Formula (3). The aromatic-ring-containing cationic component in the component (C) is preferably an aromatic sulfonium salt.

The fibrous conductive substance constituting the component (D) in the curable composition for sealing optical semiconductor is preferably a conductive nanowire. The conductive nanowire is preferably at least one conductive nanowire selected from the group consisting of metal nanowires, semiconductor nanowires, carbon fibers, carbon nanotubes, and conductive polymer nanowires. The metal nanowires are preferably silver nanowires.

A cured product according to an embodiment of the present invention is preferably a cured product of the curable composition for sealing optical semiconductor. The cured product preferably has a water vapor permeability of equal to or less than 40 g/m$^2$·day. The cured product preferably has an outgassing amount of equal to or less than 20 ppm. The cured product preferably has an outgassing amount of equal to or less than 20 ppm, and an acrolein amount of equal to or less than 3 ppm.

EXAMPLES

The present invention will be illustrated in further detail with reference to several examples below. It should be noted, however, that the examples are by no means intended to limit the scope of the present invention.

Production Example 1

Silver Nanowire Preparation

Silver nanowires were produced in conformity to the method described in Materials Chemistry and Physics, vol. 114, pp. 333-338, "Preparation of Ag nanorods with high yield by polyol process". The specific procedure will be illustrated below.

An aliquot (0.5 mL) of a solution ($6 \times 10^{-4}$ M) of $FeCl_3$ in ethylene glycol was added to 6 mL of ethylene glycol in a flask, and the mixture was heated to 150° C. Thereafter 6 mL of a mixture solution containing 0.052 M $AgNO_3$ and 0.067 M polyvinylpyrrolidone in ethylene glycol were added dropwise to the heated mixture. The resulting reaction solution was held at 150° C. for 1.5 hours. The resulting suspension (10 mL) was diluted with 800 mL of a 1:1 (by weight) solvent mixture of ethanol and acetone, subjected to centrifugal separation (at 2000 rpm for 10 minutes) two times, and yielded a silver nanowire dispersion. A part of the resulting dispersion was extracted and thermally dried, based on which the percent by weight of silver nanowires in the dispersion was determined and was found to be 2.9 percent by weight.

The prepared silver nanowires were examined to measure an average diameter (average thickness) and an average length and were found to have an average diameter of 115 nm and a length of 20 to 50 μm. The average diameter and the average length were determined by measuring the diameters (thicknesses) and lengths of hundred (100) silver nanowires using a scanning electron microscope (SEM) and respectively arithmetically averaging the diameters (thicknesses) and lengths.

Conductive Fiber-Bearing Particle (Component (D)) Preparation

Fine plastic particles used herein were fine methyl methacrylate-styrene copolymer particles (trade name SM10X-8JH, supplied by Sekisui Chemical Co., Ltd.). The product had a refractive index of 1.565, an average particle diameter of 8.3 μm, a CV of 39, and a 10% compressive strength of 2.4 to 2.5 kgf/mm$^2$. In 29.15 parts by weight of methanol, 0.85 part by weight of the fine plastic particles (0.85 parts by weight per 100 parts by weight of curable compounds) was mixed and dispersed, and yielded a fine plastic particle dispersion. The fine plastic particle dispersion was combined with 5.22 parts by weight of the silver nanowire dispersion (containing 0.15 part by weight of silver nanowires per 100 parts by weight of the curable compounds), where the silver nanowire dispersion had been prepared in the silver nanowire preparation. The mixture was stirred with heating at 70° C. for 30 minutes to remove the medium and yielded conductive fiber-bearing particles (component (D)).

The fine plastic particles had a surface area per particle of 226.9 μm$^2$. The silver nanowires had a projected area per nanowire of 2.4 μm$^2$. In consideration of the charged fine plastic particles (0.85 part by weight) and the charged silver nanowires (0.15 part by weight), it was considered that twenty silver nanowires were adsorbed by one fine plastic particle. Based on this, the ratio of the surface area (total surface area) of the fine plastic particles to the projected area (total projected area) of the silver nanowires was calculated and was found to be about 100:15.

Curable Composition Preparation

Compounds were blended in blending ratios (in part by weight) given in Tables 1 and 2, stirred at room temperature, and yielded curable compositions according to examples and comparative examples. The compounds (A1) and (A2) belong to the component (A). The compound (B) belongs to the component (B). The compounds (C)-1, (C)-2, (C)-3 and (C)-4 belong to the component (C).

Outgassing Evaluation

About 60 mg of each of the above-prepared curable compositions were weighed, irradiated with an ultraviolet ray at 2500 mJ/cm$^2$ using a UV irradiator equipped with a conveyor belt (trade name UVC-02516S1AA02, supplied by Ushio Inc.). The irradiated sample was heated in an oven (trade name DRM320DB, supplied by ADVANTEC) at 80° C. for 60 minutes. The amount of outgases evolved from the sample during heating was quantitatively determined using a gas chromatography-mass spectrometry (GC/MS) system (trade name HP6890GC/5973MSD, supplied by Agilent Technologies, Inc.) and using toluene as a reference material. Based on this, the amount [ppm] of gases (outgassing amount) emitted from the cured product of each sample curable composition was determined. In addition, the amounts [ppm] of acrolein and 1-iodo-4-methylbenzene contained in the outgases were quantitatively determined using toluene as a reference material.

Exothermic Evaluation

An aliquot (5 mg) of each of the above-prepared curable compositions was weighed to give a sample, and the sample was irradiated with an ultraviolet ray at 2500 mJ/cm$^2$ using a UV irradiator equipped with a conveyor belt (trade name UVC-02516S1AA02, supplied by Ushio Inc.). After the irradiation, the exothermic temperature and heat output in curing reaction of the sample curable composition were determined using a differential scanning calorimeter (DSC) (trade name DSC-Q2000, supplied by TA Instruments). The time from the completion of ultraviolet irradiation to the start of measurement using the DSC was set to 12 minutes.

The determined exothermic temperatures and heat output were evaluated according to criteria as follows.

A: no exothermic peak was observed at temperatures equal to or higher than 250° C. (very good curability);

B: an exothermic peak of equal to or less than 10 J/g was observed at a temperature equal to or higher than 250° C.; and C: an exothermic peak of equal to or more than 10 J/g was observed at a temperature equal to or higher than 250° C. (poor curability).

Curable Composition Dispersibility Evaluation

An aliquot (2 mL) of each of the above-prepared curable compositions was sampled in a test tube having a size of tube diameter of 1 cm and height of 2.5 cm and left stand at an ambient temperature of 25° C. and at one atmospheric pressure. The time until particles in the sample curable composition completely settled out was measured, based on which dispersibility was evaluated. The endpoint, i.e., the time when the particles completely settled out, can be determined by visually observing that the sample curable composition become transparent.

Water Vapor Barrier Properties Evaluation

Each of the above-prepared curable composition was applied to a PET film so as to give a 100-μm thick layer after curing and irradiated with an ultraviolet ray at 2500 mJ/cm$^2$ using a UV irradiator equipped with a conveyor belt (trade name UVC-02516S1AA02, supplied by Ushio Inc.) to give a cured product. The cured product was mounted to a permeability cup, and the water vapor permeability of the cured product was measured in conformity to JIS L1099 at a temperature of 60° C. and relative humidity of 90%.

Cured Product Conductivity Evaluation

Each of the above-prepared curable compositions was placed between a pair of conductive glass substrates (supplied by Luminescence Technology Corporation, having a size of 25 mm by 25 mm and including a 0.14-μm thick ITO) so as to give a 10-μm thick layer after curing, and subjected to a heat treatment at 100° C. in a nitrogen atmosphere for one hour to give a cured product. The resulting cured product was examined to measure an electrical resistivity (Ω·cm) and a voltage (V) at an ambient temperature of 25° C. and at one atmospheric pressure using an electron meter (supplied by PSS), based on which the conductivity was evaluated.

TABLE 1

|  |  | Example 1 | Example 2 | Example 3 | Com. Ex. 1 | Com. Ex. 2 |
|---|---|---|---|---|---|---|
| Curable compound | Compound (A1) | 10 | 10 | 10 | 10 | 60 |
|  | Compound (A2) | 40 | 40 | 40 | 40 | 40 |
|  | Compound (B) | 50 | 50 | 50 | 50 |  |
| Curing catalyst | Compound (C)-2 | 2.0 |  |  |  |  |
|  | Compound (C)-3 |  | 2.0 |  |  | 1.5 |
|  | Compound (C)-4 |  |  | 2.0 |  |  |
|  | PI-2074 |  |  |  | 2.0 |  |
| Outgassing amount [ppm] |  | 4.90 | 8.40 | 6.10 | 19.00 | 24.00 |
| Acrolein [ppm] |  | 0.05 | 0.52 | 0.00 | 0.27 | 3.40 |
| 1-Iodo-4-methylbenzene [ppm] |  | 0.00 | 0.00 | 0.00 | 1.30 | 0.00 |
| Exothermic evaluation (result) |  | A | A | C | — | — |

TABLE 2

| | | Example 4 | Example 5 | Example 6 | Example 7 | Example 8 | Example 9 | Example 10 | Com. Ex. 3 | Com. Ex. 4 |
|---|---|---|---|---|---|---|---|---|---|---|
| Curable compound | Compound (A1) | 10 | 43 | 10 | 10 | 10 | 10 | 10 | 10 | 60 |
| | Compound (A2) | 50 | | 50 | 50 | 50 | 50 | 50 | 50 | 40 |
| | Compound (B) | 40 | 57 | 40 | 40 | 40 | 40 | 40 | 40 | |
| Curing catalyst | Compound (C)-1 | 2.0 | 2.0 | | | | 2.0 | 2.0 | | |
| | Compound (C)-2 | | | 2.0 | | | | | | 1.5 |
| | Compound (C)-3 | | | | 2.0 | | | | | |
| | Compound (C)-4 | | | | | 2.0 | | | | |
| | PI-2074 | | | | | | | | 2.0 | |
| Conductive fiber-bearing particle (component(D)) | | 1.0 | 1.0 | 1.0 | 1.0 | 1.0 | | | 1.0 | 1.0 |
| | Micropearl AU | | | | | | | 0.95 | | |
| | Dispersibility [hour] | 62 | 73 | 60 | 62 | 60 | — | 3 | 58 | 61 |
| | Outgassing [ppm] | 9.79 | 12.26 | 13.43 | 9.89 | 11.11 | 4.79 | 10.24 | 23.70 | 29.00 |
| | Acrolein [ppm] | 0.02 | 1.00 | 0.52 | 0.05 | 0.00 | 0.02 | 0.05 | 0.27 | 3.40 |
| | Water vapor barrier properties [g/m$^2$ · day] | 23 | 38 | 22 | 23 | 36 | 23 | 24 | 40 | 20 |
| | Conductivity | 5 V or more | 5 V or more | 5 V or more | 5 V or more | 5 V or more | 0 V | 5 V or more | 5 V or more | 5 V or more |
| | Electrical resistivity [Ω · cm] | $2.0 \times 10^5$ | $2.0 \times 10^5$ | $2.0 \times 10^5$ | $2.0 \times 10^5$ | $2.1 \times 10^5$ | no conduction | $2.0 \times 10^5$ | $2.1 \times 10^5$ | $2.0 \times 10^5$ |

The components indicated in Tables 1 and 2 refer to followings:

Compound (A1): bisphenol-F diglycidyl ether (trade name YL-983U, supplied by Mitsubishi Chemical Corporation)

Compound (A2): o-phenylphenol glycidyl ether (trade name SY-OYG, supplied by Sakamoto Yakuhin Kogyo Co., Ltd.)

Compound (B): (3,4,3',4'-diepoxy)bicyclohexyl Compound (C)-1: 4-(4-biphenylthio)phenyl-4-biphenylphenylsulfonium tetrakis(pentafluorophenyl)borate Compound (C)-2: diphenyl[4-(phenylthio)phenyl]sulfonium tetrakis(pentafluorophenyl)borate Compound (C)-3: diphenyl[4-(phenylthio)phenyl]sulfonium tris(pentafluoroethyl)trifluorophosphate (trade name CPI-210S, supplied by San-Apro Ltd.)

Compound (C)-4: diphenyl[4-(phenylthio)phenyl]sulfonium hexafluorophosphate (trade name CPI-110P, supplied by San-Apro Ltd.)

PI-2074: pentafluorophenylborate tolylcumyliodonium salt (trade name PI-2074, supplied by Rhodia)

Micropearl AU: a particulate substance that includes a crosslinked polymer containing divinylbenzene as a principal component and has a gold-plated surface, trade name Micropearl AU-2085, supplied by Sekisui Chemical Co., Ltd., having an average particle diameter of 8.5 μm The results obtained from Examples 1 to 3 and Comparative Example 2 (Table 1) demonstrated that the presence of the cycloaliphatic epoxy compound (B) significantly restrained outgassing. In particular, the presence remarkably effectively restrained acrolein evolution. The results obtained from Examples 1 to 3 and Comparative Example 1 (Table 1) demonstrated as follows. The curable compositions, when including any of specific curing catalysts as the component (C), could significantly reduce the outgassing amount. In particular, these curable compositions remarkably effectively restrained 1-iodo-4-methylbenzene evolution. The specific curing catalysts each include a cationic component and an anionic component, where the cationic component contains three or more aromatic rings, and the anionic component contains a central element selected from boron and phosphorus. The results obtained from Example 1 demonstrated that remarkable effects of restraining evolution of outgases in general were obtained.

Comparisons of Examples 1 and 2 with Example 3 (Table 1) demonstrated that the component (C), when including an anionic component containing three or more aromatic rings and/or three or more aliphatic chains each containing two or more carbon atoms, offered excellent curability.

Comparisons of Example 4 to 10 with Comparative Examples 3 and 4 (Table 2) demonstrated that the cured products according to the present invention could significantly less suffered from outgassing, because the cured products each included, as the component (B), a cycloaliphatic epoxy compound and, as the component (C), a curing catalyst including an aromatic-ring-containing cationic component and an anionic component containing a central element selected from boron and phosphorus.

Comparisons of Examples 4 to 8 with Example 10 (Table 2) demonstrated that the curable compositions had excellent dispersibility even when including conductive fiber-bearing particles as the component (D). Comparisons of Examples 4 to 8 with Example 9 (Table 2) demonstrated that the cured products according to the present invention had excellent conductivity in a thickness direction because of containing the conductive fiber-bearing particles as the component (D).

The results demonstrate that the present invention can restrain the intrusion and/or evolution of moisture and gases which may adversely affect optical semiconductor elements. This allows the optical semiconductor elements and optical semiconductor devices to offer more stable performance and have longer lifetimes. The present invention can give curable compositions for sealing optical semiconductor, where the curable compositions have excellent conductivity in the thickness direction and have excellent productivity. In addition, the present invention can give optical semiconductor devices that offer stable performance and have long lifetimes.

INDUSTRIAL APPLICABILITY

The curable compositions according to the present invention are usable in uses such as encapsulating materials and sealing materials for optical semiconductor elements such as light-emitting diodes and organic electroluminescence elements. Assume that the curable compositions according to the present invention are used to encapsulate or seal optical semiconductor elements. In this case, the encapsulated or sealed optical semiconductor elements, and optical semiconductor devices using the encapsulated or sealed optical semiconductor elements are usable in uses such as light-emitting diodes, organic electroluminescence, electronic papers, and solar cells.

The invention claimed is:

1. A curable composition for sealing optical semiconductor, the curable composition comprising:
    a component (A) being a compound containing epoxy groups, excluding a cycloaliphatic epoxy compound;
    a component (B) being a cycloaliphatic epoxy compound; and
    a component (C) being a curing catalyst, the curing catalyst including:
        a cationic component containing three or more aromatic rings;
        an anionic component containing a central element selected from boron and phosphorus,
        the curing catalyst generating an acid upon application of light or heat,
    wherein the component (A) includes:
    a compound (A1) containing at least two epoxy groups, and
    a compound (A2) containing one epoxy group per molecule and having a molecular weight of 100 to 1000.

2. A curable composition for sealing optical semiconductor, the curable composition comprising:
    a component (A) being a compound containing at least one functional group selected from the group consisting of epoxy groups, oxetanyl groups, vinyl ether groups, and (meth)acryloyl groups;
    a component (B) being a cycloaliphatic epoxy compound;
    a component (C) being a curing catalyst, the curing catalyst including:
        a cationic component containing at least one aromatic ring; and
        an anionic component containing a central element selected from boron and phosphorus,
        the curing catalyst generating an acid by application of light or heat; and
    a component (D) being conductive fiber-bearing particles each including:
        a particulate substance; and
        a fibrous conductive substance lying on or over the particulate substance.

3. The curable composition according to claim 1 for sealing optical semiconductor,
    wherein the component (A) includes a compound (A1'), and
    wherein the compound (A1') contains at least one aromatic ring and at least two epoxy groups.

4. The curable composition according to claim 3 for sealing optical semiconductor,
    wherein the compound (A1') has a molecular weight of 100 to 10000.

5. The curable composition according to claim 1 for sealing optical semiconductor,
    wherein the component (A) includes a compound (A2'),
    wherein the compound (A2') contains at least one aromatic ring, contains one epoxy group, and
    wherein the compound (A2') has a molecular weight of 100 to 1000.

6. The curable composition according to claim 1 for sealing optical semiconductor,
    wherein the component (B) is a compound containing two or more cycloaliphatic epoxy groups.

7. The curable composition according to claim 1 for sealing optical semiconductor,
    wherein the component (B) has a molecular weight of 100 to 500.

8. The curable composition according to claim 1 for sealing optical semiconductor,
    wherein the component (B) is a compound devoid of ester groups and/or carbonate groups.

9. The curable composition according to claim 1 for sealing optical semiconductor,
    wherein the component (A) is a compound containing at least one aromatic ring and containing at least one epoxy group, and
    wherein the component (B) is a cycloaliphatic epoxy compound excluding aromatic-ring-containing compounds.

10. The curable composition according to claim 1 for sealing optical semiconductor,
    wherein the component (B) is a compound represented by Formula (3):

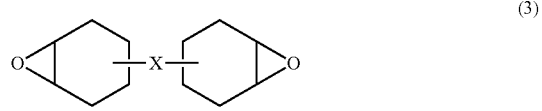

wherein X is selected from a single bond and a linkage group.

11. The curable composition according to claim 1 for sealing optical semiconductor,
    wherein the curable composition contains the component (B) in a content of 30 to 95 percent by weight based on the total weight (100 percent by weight) of the curable composition, and
    wherein the curable composition contains the component (C) in a content of 0.01 to 8 percent by weight based on the total weight (100 percent by weight) of the curable composition.

12. The curable composition according to claim 1 for sealing optical semiconductor,
    wherein the cationic component containing at least one aromatic ring in the component (C) is an aromatic sulfonium salt.

13. The curable composition according to claim 2 for sealing optical semiconductor,
    wherein the fibrous conductive substance in the component (D) is a conductive nanowire.

14. The curable composition according to claim 13 for sealing optical semiconductor,
    wherein the conductive nanowire is at least one selected from the group consisting of metal nanowires, semiconductor nanowires, carbon fibers, carbon nanotubes, and conductive polymer nanowires.

15. A cured product of the curable composition for sealing optical semiconductor according to claim 1.

16. The cured product according to claim 15,
    wherein the cured product has a water vapor permeability of equal to or less than 40 g/m$^2$·day.

17. The cured product according to claim 15,
    wherein an outgassing amount is equal to or less than 20 ppm.

18. The cured product according to claim 15,
    wherein an acrolein amount is equal to or less than 3 ppm.

19. An optical semiconductor encapsulated or sealed using the curable composition according to claim 1 for sealing optical semiconductor.

20. An optical semiconductor device comprising the optical semiconductor according to claim 19.

\* \* \* \* \*